US010811218B2

(12) United States Patent
Mori et al.

(10) Patent No.: US 10,811,218 B2
(45) Date of Patent: Oct. 20, 2020

(54) TILTING PARAMETERS CALCULATING DEVICE, SAMPLE STAGE, CHARGED PARTICLE BEAM DEVICE, AND PROGRAM

(71) Applicant: NIPPON STEEL CORPORATION, Tokyo (JP)

(72) Inventors: Takashige Mori, Tokyo (JP); Takafumi Amino, Tokyo (JP); Naoki Maruyama, Tokyo (JP); Akira Taniyama, Tokyo (JP); Shunsuke Taniguchi, Tokyo (JP); Chie Yokoyama, Tokyo (JP)

(73) Assignee: NIPPON STEEL CORPORATION, Tokyo (JP)

( * ) Notice: Subject to any disclaimer, the term of this patent is extended or adjusted under 35 U.S.C. 154(b) by 0 days.

(21) Appl. No.: 16/489,299

(22) PCT Filed: May 31, 2018

(86) PCT No.: PCT/JP2018/020901
§ 371 (c)(1),
(2) Date: Aug. 27, 2019

(87) PCT Pub. No.: WO2018/221636
PCT Pub. Date: Dec. 6, 2018

(65) Prior Publication Data
US 2020/0066481 A1  Feb. 27, 2020

(30) Foreign Application Priority Data

May 31, 2017 (JP) .................................. 2017-107747
Jun. 20, 2017 (JP) .................................. 2017-120467
(Continued)

(51) Int. Cl.
*H01J 37/20* (2006.01)
*H01J 37/26* (2006.01)
*H01J 37/28* (2006.01)

(52) U.S. Cl.
CPC .............. *H01J 37/20* (2013.01); *H01J 37/28* (2013.01); *H01J 2237/1506* (2013.01); *H01J 2237/20207* (2013.01); *H01J 2237/24475* (2013.01)

(58) Field of Classification Search
CPC ........ H01J 37/20; H01J 37/222; H01J 37/265; H01J 37/28; H01J 2237/22;
(Continued)

(56) References Cited

U.S. PATENT DOCUMENTS 5,179,280 A    1/1993  Wang
5,557,104 A    9/1996  Field et al.
(Continued)

FOREIGN PATENT DOCUMENTS

JP    2001-27619 A    1/2001
JP    2001-296258 A   10/2001
(Continued)

OTHER PUBLICATIONS

"Application of SEM Method to Observation of Image of Dislocation in Steel Material", JEOL news (Japanese) vol. 43, (2011), pp. 7-12, total of 8 pages.
(Continued)

*Primary Examiner* — Nicole M Ippolito
(74) *Attorney, Agent, or Firm* — Birch, Stewart, Kolasch & Birch, LLP

(57) ABSTRACT

There is provided a tilting parameters calculating device for use in a charged particle beam device for making a charged particle beam irradiated to a surface of a sample mounted on a sample stage, the tilting parameters calculating device being configured to calculate tilting parameters, the tilting parameters being input parameters to control a tilting direction and a tilting value of the sample and/or the charged particle beam, the input parameters being necessary to
(Continued)

change an incident direction of the charged particle beam with respect to the sample, the tilting parameters calculating device including a tilting parameters calculating unit for calculating the tilting parameters based on information that indicates the incident direction of the charged particle beam with respect to a crystal lying at a selected position on the surface in a state where the incident direction of the charged particle beam with respect to the sample is in a predetermined incident direction, the information being designated on a crystal orientation figure, which is a diagram illustrating the incident direction of the charged particle beam with respect to a crystal coordinate system of the crystal.

16 Claims, 31 Drawing Sheets

(30) Foreign Application Priority Data

| Apr. 3, 2018 | (JP) | ................................. 2018-071541 |
| Apr. 25, 2018 | (JP) | ................................. 2018-084534 |
| Apr. 26, 2018 | (JP) | ................................. 2018-085823 |

(58) Field of Classification Search
CPC ....... H01J 2237/2809; H01J 2237/1506; H01J 2237/20207; H01J 2237/24475; G01N 23/2251
USPC .......................... 250/306, 307, 309, 310, 311
See application file for complete search history.

(56) References Cited

U.S. PATENT DOCUMENTS

| 6,548,811 B1 * | 4/2003 | Nakamura | .............. H01J 37/26 250/306 |
| 2003/0130803 A1 | 7/2003 | Chou et al. | |
| 2012/0043463 A1 * | 2/2012 | Agemura | ................ H01J 37/26 250/310 |

FOREIGN PATENT DOCUMENTS

| JP | 2003-121394 A | 4/2003 |
| JP | 2016-139513 A | 8/2016 |
| JP | 2018-22592 A | 2/2018 |

OTHER PUBLICATIONS

International Search Report for PCT/JP2018/020901 (PCT/ISA/210) dated Aug. 21, 2018.
Sugiyama et al., "Application of Electron Channeling Contrast Imaging in a Scanning Electron Microscope for Dislocation Analysis", KENBIKYO vol. 48, No. 3, 2013, pp. 216-220, total of 6 pages.
Written Opinion of the International Searching Authority for PCT/JP2018/020901 (PCT/ISA/237) dated Aug. 21, 2018.
International Preliminary Report on Patentability and Written Opinion of the International Searching Authority (Forms PCT/IB/326, PCT/IB/373, and PCT/ISA/237) for International Application No. PCT/JP2018/020901, dated Dec. 12, 2019, with English translation of the Written Opinion.

* cited by examiner (a)

(b)

(a) CB (b) CB →

TILTING PARAMETERS CALCULATING DEVICE, SAMPLE STAGE, CHARGED PARTICLE BEAM DEVICE, AND PROGRAM

TECHNICAL FIELD

The present invention relates to a tilting parameters calculating device, a sample stage and a charged particle beam device including the tilting parameters calculating device, and a program.

BACKGROUND ART

A scanning electron microscope (SEM) is a device for observing a surface structure, crystal grains, and a dislocation occurring in proximity to a surface, and the like of a material by converging an accelerated electron beam into an electron beam flux, irradiating a sample surface with the electron beam flux while scanning periodically, detecting backscattered electrons and/or secondary electrons, etc. generated from a local region of the irradiated sample, and converting these electric signals into a microstructure image of the material.

The electron beam drawn in vacuum from an electron source is immediately accelerated with energy varied depending on an observation purpose, ranging from a low accelerating voltage of 1 kV or less to a high accelerating voltage of about 30 kV. The accelerated electron beam is then focused through magnetic field coils including condenser lenses, an objective lens, and the like into a nanoscale, ultra small spot size of the electron beam flux, which is deflected by deflection coils at the same time. In such a manner, the sample surface is scanned with the converged electron beam flux. Recently, an additional combination with an electric field coil has been in use for focusing an electron beam.

Because of its constraint on resolution, a main function of conventional SEMs has been to observe a surface structure of a sample with a secondary electron image and investigate chemical composition information on the sample with a backscattered electron image. In contrast, it has recently become possible to focus an accelerated electron beam into an ultra small spot size of a few nanometers with its luminance being kept high, allowing very high resolution backscattered electron images and secondary electron images to be acquired.

In conventional practice, a most prevalent method for observing a lattice defect is that under a transmission electron microscope (TEM). In even such a high-resolution SEM described above, however, it has become possible to use an electron channeling contrast imaging (ECCI) method, which effectively utilizes a backscattered electron image, to observe information on a lattice defect inside a sample (hereafter, also referred to as an "internal defect") only on a top surface (up to a depth of about 100 nm from a surface) of a crystalline material (see Non-Patent Documents 1 and 2).

LIST OF PRIOR ART DOCUMENTS

Patent Document

Patent Document 1: JP2016-139513A
Patent Document 2: JP2018-022592A

Non Patent Document

Non-Patent Document 1: JEOL news (Japanese) Vol. 43, (2011) p. 7-12

Non-Patent Document 2: Kenbikyo Vol. 48, No. 3 (2013) p. 216-220

SUMMARY OF INVENTION

Technical Problem

In a crystalline material observed by the SEM-ECCI method, a large difference in brightness and darkness of an observation image occurs due to different crystal orientations. A specific crystal orientation gives a darkest observation image. Such a condition is called an electron channeling condition (hereafter, also referred to simply as a "channeling condition"). The channeling condition can be satisfied by adjusting an incident direction of an electron beam with respect to a sample.

In an SEM, a backscattered electron intensity depends on an angle formed by an incident electron beam and a predetermined crystal plane changes. When the angle formed by the incident electron beam and the predetermined crystal plane satisfy a specific condition, the incident electron beam may enter a crystal deeply and may be prevented from being reflected, and the backscattered electron intensity decreases to a minimum. This condition refers to the channeling condition.

Even under the same condition, however, a portion where a crystal plane is disarranged locally by a lattice defect such as a dislocation and a stacking fault reflects an electron beam partially, so that the backscattered electron intensity increases. As a result, a contrast between a background and the lattice defect is enhanced, and thus the internal defect can be distinguished for observation.

To observe such a contrast caused by a lattice defect, it is necessary to grasp rotation tensor/parameters of crystal coordinate system to sample coordinate system (hereafter, referred to simply as "crystal orientation information"). SEMs are often equipped additionally with an electron backscatter diffraction (EBSD) device to analyze a crystal orientation, which enables EBSD patterns to be acquired.

An effective method to acquire a lattice defect image having a strong contrast to its background is to tilt a sample to satisfy a channeling condition and to observe a backscattered electron image, in consideration of crystal orientations analyzed from an EBSD pattern obtained by EBSD.

Now, to acquire an EBSD pattern, a sample needs to be tilted as much as 70°. Geometric arrangements of a backscattered electron detector for acquiring a backscattered electron image using an SEM include a forward scattered mode in which the backscattered electron detector is arranged directly below an EBSD detector and a backscattered mode in which the backscattered electron detector is arranged directly below an electron gun. The forward scattered mode allows a backscattered electron image to be acquired with a sample tilted as much as 70°, whereas a high resolution image cannot be acquired in the forward scattered mode because a large aberration of an incident electron beam occurs.

On the other hand, the backscattered mode allows a high resolution image that reflects an internal defect to be acquired, whereas a problem with the backscattered mode is that acquisition of a backscattered electron image cannot coincide with acquisition of an EBSD pattern through EBSD. Alternatively, a backscattered electron image and an EBSD pattern can be acquired alternately, but this requires a sample to be tilted greatly at every acquisition, which raises a problem in not only that a crystal grain to be measured may move out of a visual field but also that a work time for the acquisition becomes lengthy.

In addition, observation of a lattice defect using a TEM is preferably conducted under a Bragg condition, where only a diffracted wave on a specific crystal plane is strongly excited. The Bragg condition is also satisfied by adjusting an incident direction of an electron beam with respect to a sample. TEM, however, does not allow an electron diffraction pattern containing crystal orientation information and an observation image to be acquired at the same time, either. Accordingly, to control an incident direction of electron beam with respect to a crystal coordinate system of a crystal to be measured, an intended orientation relationship has to be established by position alignment using an observation image and a check on a crystal orientation using an electron diffraction pattern at frequent intervals, which requires a lot of work for observation.

The present invention has an objective to provide a tilting parameters calculating device, a sample stage and a charged particle beam device including the tilting parameters calculating device, and a program, the tilting parameters calculating device enabling adjustment of an incident direction of a charged particle beam with respect to the sample so that a desired crystal orientation figure can be created even in a case where measurement is conducted in a charged particle beam device such as an SEM, TEM, and scanning ion microscope (SIM), using any function provided by the charged particle beam device.

Solution to Problem

The present invention has been made to solve the problems described above.

A tilting parameters calculating device according to an embodiment of the present invention is a device for use in a charged particle beam device for making a charged particle beam irradiated to a surface of a sample mounted on a sample stage, the device being configured to calculate tilting parameters, the tilting parameters being input parameters to control a tilting direction and a tilting value (tilting angle depended on an axis line) of the sample and/or the charged particle beam, the input parameters being necessary to change an incident direction of the charged particle beam with respect to the sample, the tilting parameters calculating device including a tilting parameters calculating unit for calculating the tilting parameters based on information that indicates an incident direction of the charged particle beam with respect to a crystal lying at a selected position on the surface in a state where the incident direction of the charged particle beam with respect to the sample is in a predetermined incident direction, the information being designated on a crystal orientation figure, which is a diagram illustrating the incident direction of the charged particle beam with respect to a crystal coordinate system of the crystal.

In addition, a program according to an embodiment of the present invention is a program for use in a charged particle beam device for making a charged particle beam irradiated to a surface of a sample mounted on a sample stage, the program being run on a computer to calculate tilting parameters, the tilting parameters being input parameters to control a tilting direction and a tilting value (tilting angle depended on an axis line) of the sample and/or the charged particle beam, the input parameters being necessary to change an incident direction of the charged particle beam with respect to the sample, the program causing the computer to execute a step of, with an incident direction of the charged particle beam with respect to the sample being a predetermined incident direction, calculating the tilting parameters based on information that indicates an incident direction of the charged particle beam with respect to a crystal lying at a selected position on the surface, the information being designated on a crystal orientation figure, which is a diagram illustrating the incident direction of the charged particle beam with respect to a crystal coordinate system of the crystal.

Advantageous Effects of Invention

According to the present invention, it is possible to calculate tilting parameters for adjusting an incident direction of a charged particle beam so that a desired crystal orientation figure can be created even while measurement is conducted in a charged particle beam device such as an SEM, TEM, and SIM, using any function provided by the charged particle beam device.

DESCRIPTION OF EMBODIMENTS

A tilting parameters calculating device, a sample stage, a charged particle beam device, and a program according to embodiments of the present invention will be described with reference to FIGS. 1 to 46.

[Configuration of Tilting Parameters Calculating Device]

Figure 1:
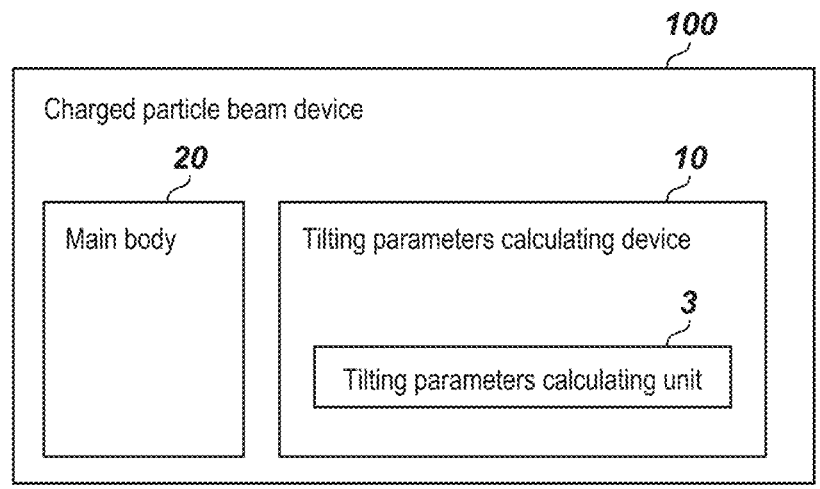
FIG. 1 is a diagram illustrating a schematic configuration of a tilting parameters calculating device according to an embodiment of the present invention.

FIG. 1 is a diagram illustrating a schematic configuration of a charged particle beam device including a tilting parameters calculating device according to an embodiment of the present invention. A tilting parameters calculating device 10 according to an embodiment of the present invention is a device for use in a charged particle beam device 100 for making a charged particle beam irradiated on a surface of a sample mounted on a sample stage, the device being configured to calculate tilting parameters, the tilting parameters being input parameters to control a tilting direction and a tilting value (tilting angle depended on an axis line) of the sample and/or the charged particle beam, the input parameters being necessary to change an incident direction of the charged particle beam with respect to the sample. Examples of the charged particle beam include an electron beam, an ion beam, and the like. Examples of the charged particle beam device 100 include an SEM, TEM, SIM, focused ion beam (FIB) processing system, and the like.

In the example illustrated in FIG. 1, the tilting parameters calculating device 10 is included in the charged particle beam device 100 but may be included in, for example, a sample stage on which a sample is mounted. The tilting parameters calculating device 10 may be directly incorporated into the charged particle beam device 100 or the sample stage, or may be built in a general-purpose computer connected to the charged particle beam device 100 or the sample stage. The tilting parameters calculating device 10 may be built in a general-purpose computer that is not connected to the charged particle beam device 100 or the sample stage.

The tilting parameters calculating device 10 according to an embodiment of the present invention includes a tilting parameters calculating unit 3 calculating the above tilting parameters based on information that indicates an incident direction of the charged particle beam with respect to a crystal (hereinafter, also referred to as a "crystal A") lying at a position selected on the sample surface (hereinafter, also referred to as a "position A") designated on a crystal orientation figure of the crystal A, in a state where an incident direction of a charged particle beam with respect to a sample is in a predetermined incident direction (hereinafter, also referred to as a "standard status").

The tilting parameters are input parameters to control a tilting direction and a tilting value (tilting angle depended on axis line) of the sample and/or the charged particle beam. For example, the tilting direction and the tilting value of the sample and/or the charged particle beam may be directly specified. The tilting parameters may be, for example, a tilting direction and a tilting value that are necessary to drive the sample stage on which the sample is mounted. Specifically, an example of the tilting parameters is information that indicates a tilting direction and a tilting value on a Tx axis, and a tilting direction and a tilting value on a Ty axis with respect to the sample stage including the two orthogonal tilt axes Tx and Ty. The tilting parameters may be information necessary to incline the incident direction of the charged particle beam. Specifically, information relating to an amount of change in excitation of a condenser lens will suffice.

The above crystal orientation figure is a diagram indicating an incident direction of a charged particle beam with respect to a crystal coordinate system of a crystal to be measured, that is, the crystal A, and is created through calculation.

Figure 2:
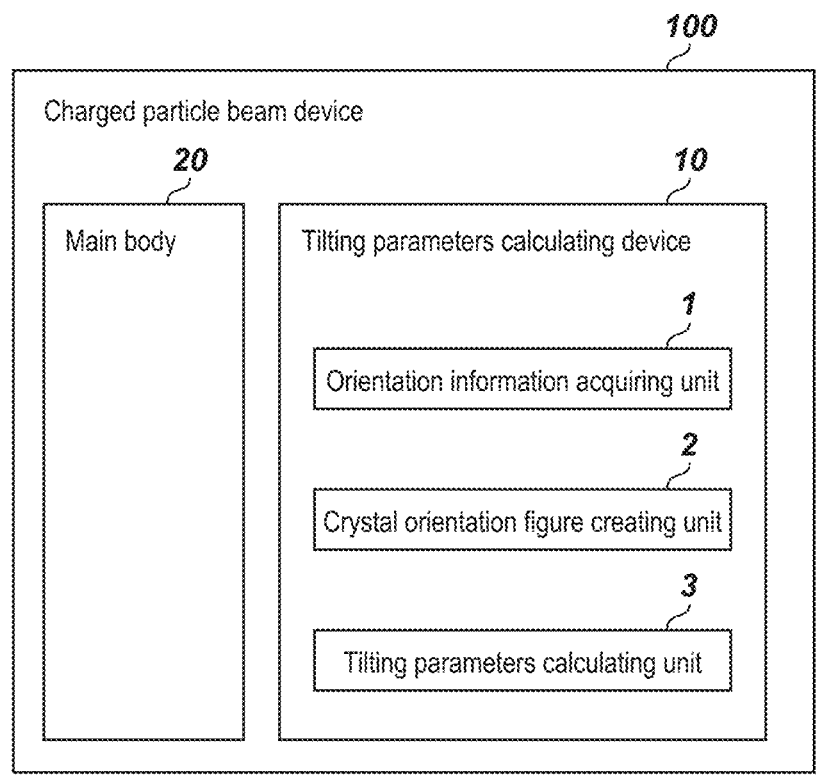
FIG. 2 is a diagram specifically illustrating a configuration of the tilting parameters calculating device according to an embodiment of the present invention.

Next, a configuration of the tilting parameters calculating device according to an embodiment of the present invention will be described more specifically with reference to FIG. 2. FIG. 2 is a diagram specifically illustrating the configuration of the tilting parameters calculating device according to an embodiment of the present invention.

As illustrated in FIG. 2, the tilting parameters calculating device 10 according to an embodiment of the present invention includes an orientation information acquiring unit 1, a crystal orientation figure creating unit 2, and the tilting parameters calculating unit 3.

The orientation information acquiring unit 1 is configured to acquire crystal orientation information on a sample surface. Based on the crystal orientation information, the crystal orientation figure creating unit 2 is configured to create a crystal orientation figure of a crystal A present at the position A on the sample surface in the standard status.

As described above, the crystal orientation information means orientation information indicating a rotation of a crystal coordinate system with respect to a sample coordinate system. As described above, the crystal orientation figure is a diagram indicating an incident direction of a charged particle beam with respect to a crystal coordinate system of a crystal to be measured, that is, the crystal A, and is created through calculation.

The sample coordinate system here means a coordinate system fixed to a sample, and the crystal coordinate system is a coordinate system fixed to a crystal lattice. When an incident direction of a charged particle beam with respect to a crystal coordinate system of a sample is specified, crystal orientation information on an object to be measured is used to calculate an incident direction of the charged particle beam with respect to a sample coordinate system, which makes it possible to calculate a tilting direction and a tilting value (tilting angle depended on an axis line) of the sample and/or the charged particle beam to fulfill the incident direction.

Figure 3:
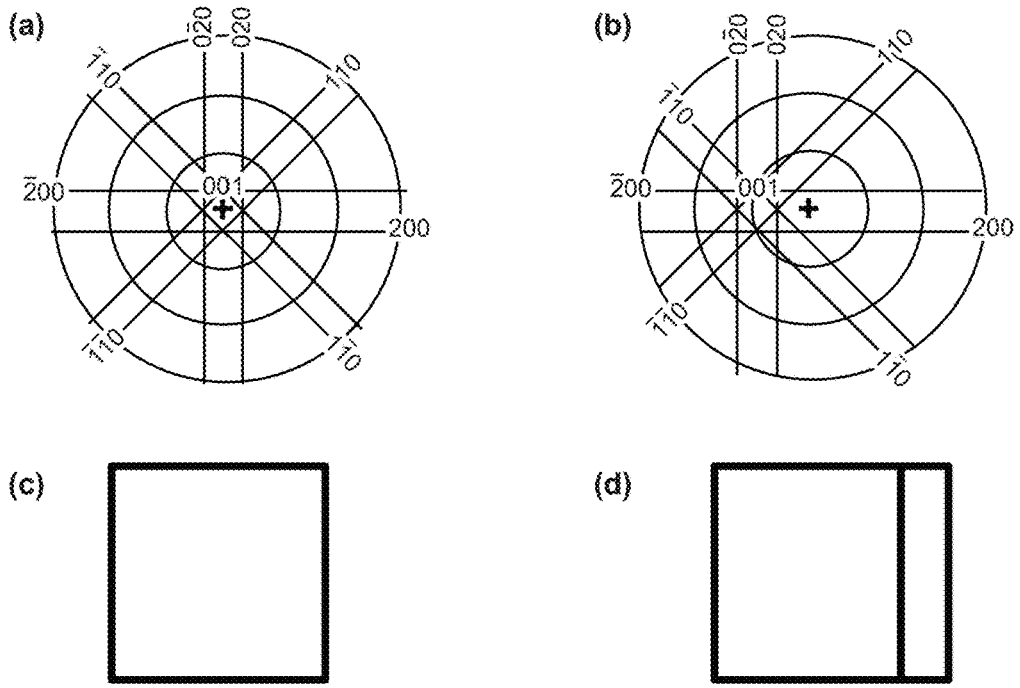
FIG. 3 is a diagram illustrating an example of crystal orientation figures.
Figure 4:
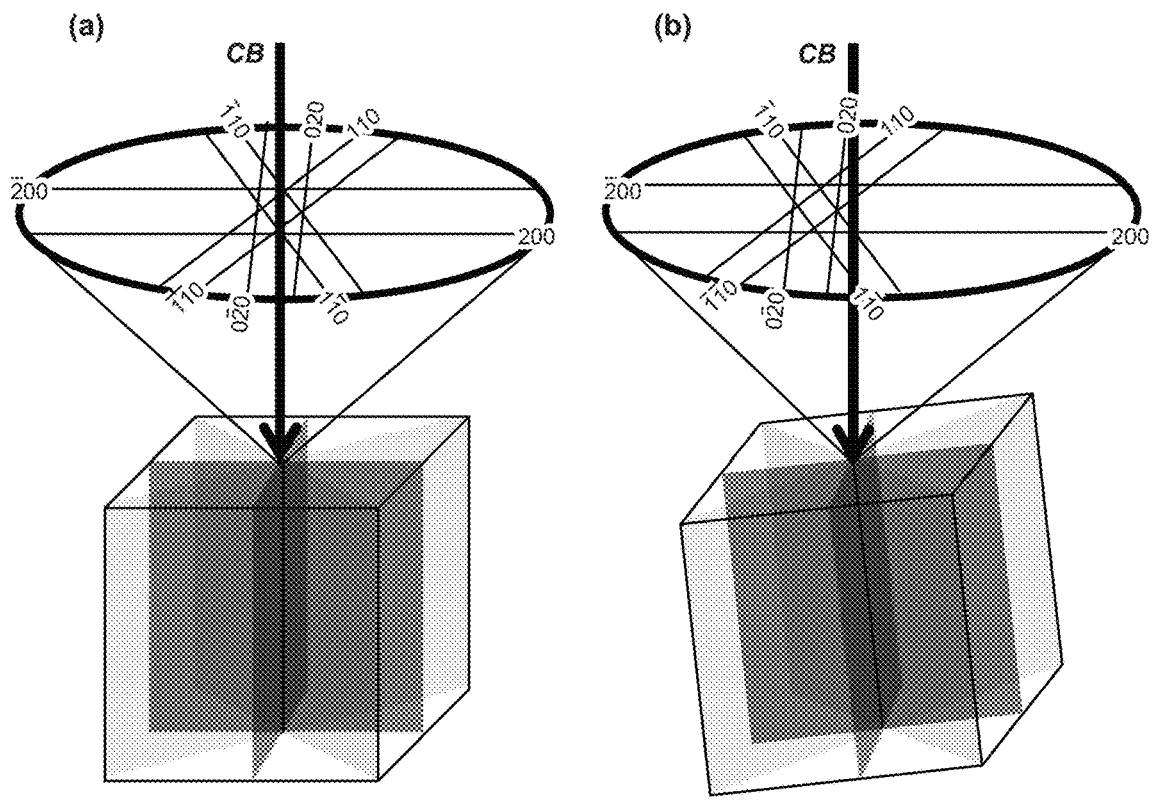
FIG. 4 is a conceptual diagram used for describing a correspondence between a Kikuchi map and a schematic diagram of real lattice.

As the crystal orientation figure, use can be made of an indexed Kikuchi map (hereinafter, referred to simply as a "Kikuchi map"), a stereographic projection of crystal plane, a schematic diagram of real lattice, and a calculated electron diffraction pattern. An example of crystal orientation figures is illustrated in FIG. 3. FIGS. 3a and 3b are diagrams illustrating an example of Kikuchi maps, and FIGS. 3c and 3d are diagrams illustrating an example of schematic diagrams of real lattice. FIG. 4 is a conceptual diagram used for describing a correspondence between a Kikuchi map and a schematic diagram of real lattice.

In a state illustrated in FIGS. 3a, 3c, and 4a, a direction of a [001] zone axis included in a crystal is parallel to an incident direction of a charged particle beam CB. The incident direction of the charged particle beam CB is indicated in FIGS. 3a and 3b in a form of a cross illustrated in centers of the drawings, and the incident direction of the charged particle beam CB in FIGS. 3c and 3d is a direction perpendicular to the paper. In contrast, when the crystal is rotated with respect to the incident direction of the charged particle beam CB as schematically illustrated in FIG. 4b, the Kikuchi map and the schematic diagram of real lattice change into a state illustrated in FIGS. 3b and 3d. The present specification will give description, as an example, about a case of using an indexed Kikuchi map as the crystal orientation figure.

The crystal orientation information can be acquired by conducting a point analysis, a mapping analysis, or other kinds of analyses using an EBSD method, a transmission EBSD method, a TEM method, a TEM-automated crystal orientation mapping (TEM-ACOM) method, an electron channeling pattern (ECP), and the like.

The crystal orientation information may be obtained by measuring it using the charged particle beam device 100 including the tilting parameters calculating device 10, or may be obtained in a form of data obtained by measuring it using an external device. The crystal orientation information includes numeric data containing orientation information indicating rotation of a crystal coordinate system to a sample coordinate system and image data on an actually-measured EBSD pattern, electron channeling pattern, or electron diffraction pattern.

The numeric data contains, for example, data on crystal orientations converted into rotation vectors such as Rodrigues vectors, data on crystal orientations converted into rotation matrices represented by Euler angles with respect to a virtual orthogonal coordinate system on a sample surface, and the like. The conversion into the numeric data may be performed by the orientation information acquiring unit 1 or may be performed by an external device. In the present invention, "numeric data" is supposed to mean data represented in a form of set of numeric values.

In the configuration described above, the crystal orientation figure creating unit 2 is configured to create a crystal orientation figure through calculation based on the numeric data. For example, as the numerical data, use can be made of an analysis result such as an EBSD pattern or an electron channeling pattern actually measured by an EBSD, ECP, or the like. The analysis result contains not only the crystal orientation information but also information on a geometric arrangement of a sample with respect to a charged particle beam, and the calculated crystal orientation figure is therefore associated with the geometric arrangement of the sample. That is, analyzing an actually-measured EBSD pattern or the like allows the sample coordinate system and the crystal coordinate system described above to be associated with each other.

In contrast, the image data such as an actually-measured EBSD pattern, electron channeling pattern, and electron diffraction pattern can be captured using an EBSD, ECP, TEM, or the like. The image data may be a plurality of image data items captured in a predetermined region on a sample surface or may be one image data item captured at the position A. Examples of the image data include kinds of data in, for example, a bitmap format (BMP), JPEG format, GIF format, PNG format, TIFF format, and the like.

In the above configuration, the crystal orientation figure creating unit 2 is configured to create a crystal orientation figure by performing image analysis on image data such as an EBSD pattern, electron channeling pattern, or an electron diffraction pattern that are actually measured at the position A.

The position at which the crystal orientation figure is created may be registered in advance or may be configured to be selected automatically as a position conforming to a preregistered condition.

In addition, the crystal orientation figure creating unit 2 may create a crystal orientation map such as an IPF map (Inverse Pole Figure map) beforehand based on the numeric data converted into the above Euler angles or the like, the IPF map representing crystal orientations in a form of color tones according to a measurement position, and then create a crystal orientation figure at a position selected on the IPF map.

As the crystal orientation map, use may be made of the IPF map, as well as a map in which colors tell different crystal phases, a map that illustrates grain boundaries based on orientation information, a map that illustrates a strain distribution obtained by differentiation of orientation difference between pixels, or the like.

How to select the position for creating the crystal orientation figure is not limited to the example described above, and the position may be selected on an observation image in the charged particle beam device such as an SEM, TEM, and FIB. Alternatively, the position for creating the crystal orientation figure may be selected based on information obtained by analyzing an EBSD pattern, an electron channeling pattern, an electron diffraction pattern, or other patterns that are actually measured beforehand in a predetermined region of the sample surface.

The information contains, for example, information relating to image qualities of actually-measured EBSD patterns at measurement points, information on values of errors between the actually-measured EBSD pattern and a Kikuchi map that is created by calculating crystal orientations, the errors being calculated for every pixel, and the like.

There is also no limitation on the incident direction of the charged particle beam with respect to the sample in the standard status, and the incident direction may be set as appropriate. For example, an incident direction perpendicular to a sample surface can be set as the incident direction of the charged particle beam in the standard status.

Thereafter, based on information indicating the incident direction of the charged particle beam with respect to the crystal A, which is designated on the crystal orientation figure, the tilting parameters calculating unit 3 calculates a tilting parameters necessary to change a relative orientation relationship between the sample and the incident direction of the charged particle beam. Here, changing the relative orientation relationship between the sample and the incident direction of the charged particle beam means adjusting a relative tilted state of the sample with respect to the incident direction of the charged particle beam, specifically means at least one of changing a tilting direction and a tilting value (tilting angle depended on an axis line) of the sample and changing a tilting direction and a tilting value (tilting angle depended on an axis line) of the charged particle beam.

The incident direction of the charged particle beam with respect to the crystal coordinate system of the crystal to be measured is shown by, for example, indicating an incident direction of an electron beam together with orientations of the crystal displayed on a Kikuchi map. In the example illustrated by FIGS. 3*a* and 3*b*, the incident direction of the charged particle beam is indicated in a form of crosses at centers of the drawings.

In the Kikuchi map illustrated in FIG. 3*a*, the incident direction of the charged particle beam coincides with the [001] zone axis of the crystal. For example, when an operator then instructs the incident direction of the charged particle beam to rotate by 30° about a rotation axis, which is in a direction parallel to a (200) plane of the crystal while referring to the Kikuchi map, the tilting parameters calculating device 10 calculates tilting parameters necessary to change the relative orientation relationship between the sample and the incident direction of the charged particle beam, according to an amount of change in information indicating the incident direction in the crystal coordinate system.

The incident direction of the charged particle beam on the Kikuchi map can be changed without updating the Kikuchi map by instructing the incident direction of the charged particle beam to be at any angle as in the above example, or can be changed by, for example, an operation of an operator instructing that another Kikuchi map indicating a desired orientation relationship, as illustrated in FIG. 3*b*, is to be created again with the incident direction of the charged particle beam displayed always at a fixed position.

There is no limitation on how to calculate the tilting parameters based on the information specified on the crystal orientation figure, and for example, the following method can be employed. Assuming that, in a sample stage including two tilt axes Tx and Ty that intersect each other, rotation amounts about the axes are represented in an x axis and a y axis of the crystal orientation figure, it is possible to use a method in which the tilting parameters are converted into rotation directions and rotation amounts about the Tx axis and the Ty axis according to amounts of change in coordinates of information indicating the incident direction in the crystal orientation figure.

Having the above configuration, the tilting parameters calculating device 10 is able to calculate tilting parameters necessary to change the incident direction of the charged particle beam with respect to the sample so that a desired crystal orientation figure is created.

The crystal orientation figure creating unit 2 may create a designated crystal orientation figure based on the information specified on the crystal orientation figure. In the example illustrated in FIG. 3, the Kikuchi map of FIG. 3(*b*) corresponds to the designated crystal orientation figure. In the present specification, a crystal orientation figure created based on information designated on a crystal orientation figure is called a "designated crystal orientation figure."

A number of positions for creating the crystal orientation figure is not limited to one. For example, the crystal orientation figure creating unit 2 may create a crystal orientation figure of a crystal (also referred to herein as a "crystal B") in the standard status at a position different from the position A (also referred to herein as a "position B") based on crystal orientation information in the sample surface. The tilting parameters calculating unit 3 is then able to calculate the tilting parameters based on pieces of information that indicate incident directions of the charged particle beam with respect to the crystal A and the crystal B and are designated on the crystal orientation figure of the crystal A and the crystal orientation figure of the crystal B, respectively.

In addition, the crystal orientation figure creating unit 2 may create a designated crystal orientation figure of the crystal A as well as a designated crystal orientation figure of the crystal B.

The number of positions for creating the crystal orientation figure may be three or more. There is also no limitation on how to select a plurality of positions described above, and the plurality of positions may be selected from within a single crystal grain or may be selected from different crystal grains.

For example, a lattice defect in a polycrystalline material such as a steel material can be formed also by deformation of the material or propagation of a crack and can propagate across a plurality of crystal grains. Such a case requires a lattice defect in a plurality of crystal grains to be observed at the same time. By calculating tilting parameters based on information designated on crystal orientation figures of a plurality of crystals as described above, it is possible to perform adjustment to a tilting angle that satisfies channeling conditions for the plurality of crystals at the same time easily. As a result, it is possible to observe the lattice defect propagating across the plurality of crystal grains continuously.

In addition, when a stress is put on a material under conditions that satisfies channeling conditions for a plurality of crystal grains at the same time, it is possible to observe how a lattice defect such as a crack straddles crystal grains in situ.

Figure 5:
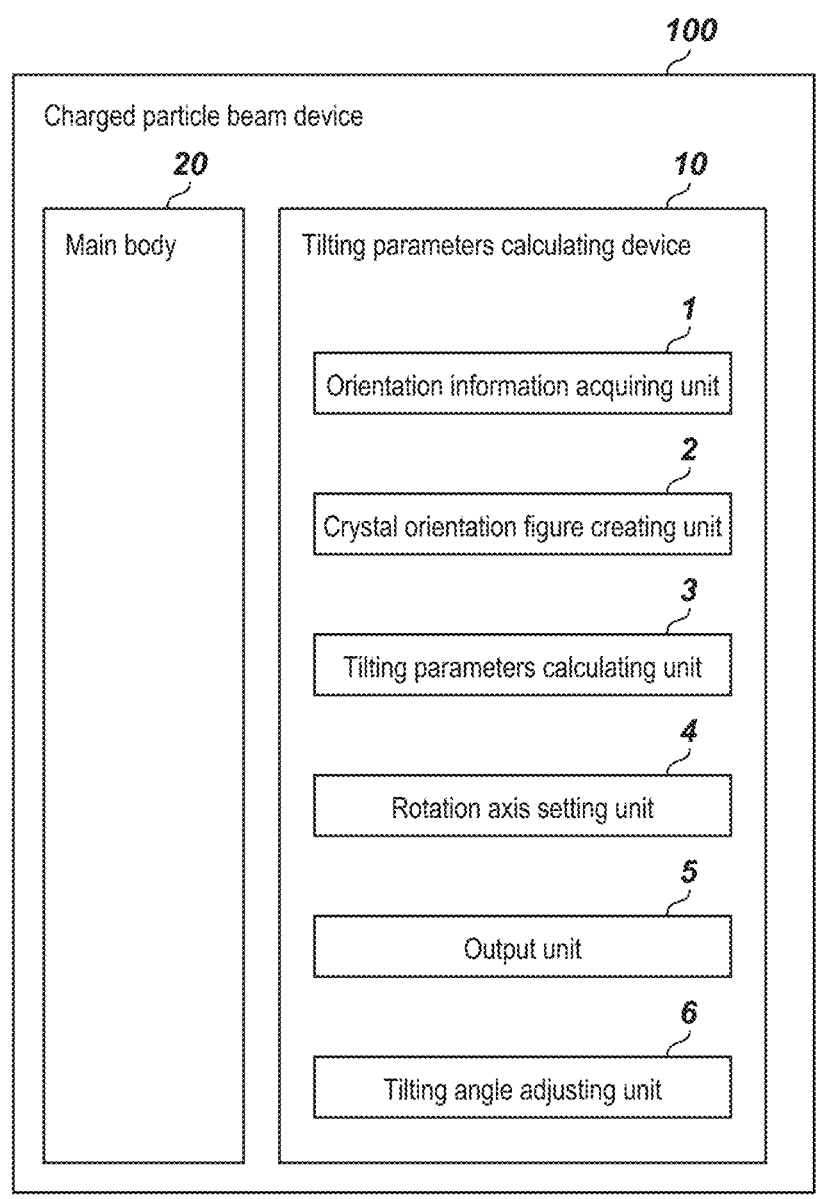
FIG. 5 is a diagram specifically illustrating a configuration of a tilting parameters calculating device according to another embodiment of the present invention.

FIG. 5 is a diagram specifically illustrating a configuration of a tilting parameters calculating device according to another embodiment of the present invention. As illustrated in FIG. 5, a tilting parameters calculating device 10 according to another embodiment of the present invention may further include a rotation axis setting unit 4.

The rotation axis setting unit 4 is configured to set an axis that passes the position A as a rotation axis based on the crystal orientation figure created by the crystal orientation figure creating unit 2. The rotation axis means an axis that serves as a rotation center of rotation of a predetermined crystal plane relative to the incident direction of the charged particle beam. By setting the axis passing the position A, it is possible to change an inclination of the sample about the position A in a eucentric manner. The axis serving as the rotating axis need not pass the position A strictly.

In order to make one crystal plane included in the crystal A (hereinafter, also referred to as a "crystal plane a") and the incident direction form a predetermined angle, the rotation axis setting unit 4 makes settings such that the axis serving as the rotation axis is parallel or perpendicular to the crystal plane a, based on the information designated on the crystal orientation figure.

The tilting parameters calculating unit 3 then calculates tilting parameters that are necessary to change a tilting direction and a tilting value (tilting angle depended on an axis line) of the sample and/or the charged particle beam about the rotation axis so that the crystal plane a and the incident direction form the predetermined angle.

The rotation axis setting unit 4 preferably sets two axes that intersect each other at the position A as rotation axes based on the crystal orientation figure created by the crystal orientation figure creating unit 2. By setting the two axes intersecting each other at the position A, it is possible to change an inclination of the sample about the position A freely in a eucentric manner.

In the above aspect, using the crystal orientation figure created by the crystal orientation figure creating unit 2, the rotation axis setting unit 4 can make settings such that one of the set two axes (hereinafter, also referred to as an "α axis") is in a direction parallel or perpendicular to the crystal plane a. To set a direction parallel to the crystal plane a as a direction of the α axis, the α axis may be set such that the α axis is further parallel to the sample surface, or may be set such as to be parallel to one arranging direction of atoms forming the crystal plane a.

The other of the two axes (hereinafter, also referred to as a "β axis") has no limitation on its direction and may be set, for example, as to be parallel to the crystal plane a. In this case, the β axis may be set such that the β axis is further parallel to the sample surface, or may be set such that the β axis is in a direction parallel to one arranging direction of atoms forming the crystal plane a.

In addition, the direction of the β axis may be set such that the direction is parallel or perpendicular to another crystal plane (hereinafter, also referred to as a "crystal plane b") of the crystal A. To set a direction parallel to the crystal plane b as a direction of the β axis, the β axis may be set such that the β axis is further parallel to the sample surface, or may be set such as to be parallel to an arranging direction of atoms forming the crystal plane b.

As illustrated in FIG. 5, the tilting parameters calculating device 10 according to another embodiment of the present invention may further include an output unit 5. The output unit 5 is configured to acquire a charged particle beam image of the sample surface in the standard status measured by the charged particle beam device 100 and the crystal orientation figure of the crystal A created by the crystal orientation figure creating unit 2, and/or the designated crystal orientation figure described above. Examples of the charged particle beam image include a backscattered electron image, a secondary electron image, a transmitted electron image, an SIM image, and an STEM image.

The output unit 5 is configured to then output the acquired charged particle beam image and the crystal orientation figure of the crystal A, and/or the designated crystal orientation figure to an external display device in such that the image and figures are displayed at the same time. The displaying device is a liquid crystal display monitor or the like. At this time, the output unit 5 may output the charged particle beam image and the crystal orientation figure, and/or the designated crystal orientation figure to one display device, or may output the charged particle beam image to one display device and output the crystal orientation figure and/or the designated crystal orientation figure to another display device.

As described above, the charged particle beam device 100 cannot measure a charged particle beam image at the same time with an EBSD pattern, an electron channeling pattern, or an electron diffraction pattern. However, since the designated crystal orientation figure is created by calculation rather than actual measurement, and a charged particle beam image corresponding to the incident direction of the charged particle beam corresponding to the designated crystal orientation figure is measured, the output unit 5 is therefore able to cause, for example, the charged particle beam image and the Kikuchi map to be displayed at the same time.

In a case where the crystal orientation figure creating unit 2 also creates a crystal orientation figure of the crystal B, the output unit 5 may further acquire the crystal orientation figure of the crystal B and/or the designated crystal orientation figure of the crystal B, and may output the charged particle beam image, and the crystal orientation figure of the crystal A and/or the designated crystal orientation figure of the crystal A, as well as the crystal orientation figure of the crystal B and/or the designated crystal orientation figure of the crystal B so that the image and figures are displayed at the same time.

The output unit 5 may acquire the charged particle beam image, the crystal orientation figure and the designated crystal orientation figure, as well as an IPF map created beforehand by the crystal orientation figure creating unit 2 and output the image, figures, and map such that the image, figures, and map are displayed on the external display device at the same time.

In a case where the sample has properties of interacting with a magnetic field, such as magnetism and diamagnetism, the charged particle beam can be slightly inclined as the sample is tilted, under influence of the magnetic field. In such a case, a conceivable possibility is that the incident direction calculated according to the designated crystal orientation figure created by the crystal orientation figure creating unit 2 deviates from an actual incident direction of the charged particle beam with respect to the sample.

Hence, when such a sample described above is to be used, it is preferable that the standard status is reset every predetermined time period or every time the incident direction of the charged particle beam with respect to the sample changes by a predetermined amount, and the crystal orientation figure creating unit 2 creates a crystal orientation figure in the reset standard status over again.

As illustrated in FIG. 5, the tilting parameters calculating device 10 according to another embodiment of the present invention may further include a tilting angle adjusting unit 6. The tilting angle adjusting unit 6 is configured to, based on the tilting parameters calculated by the tilting parameters calculating unit 3, perform at least one of instructing the sample stage installed inside the charged particle beam device 100 to change a tilting direction and a tilting value (tilting angle depended on an axis line) of the sample, and instructing the charged particle beam device 100 to change a tilting direction and a tilting value (tilting angle depended on an axis line) of the charged particle beam.

The instruction may be given to the sample stage via a sample stage driving device included in the charged particle beam device 100 or via an external sample stage driving device.

Figure 6:
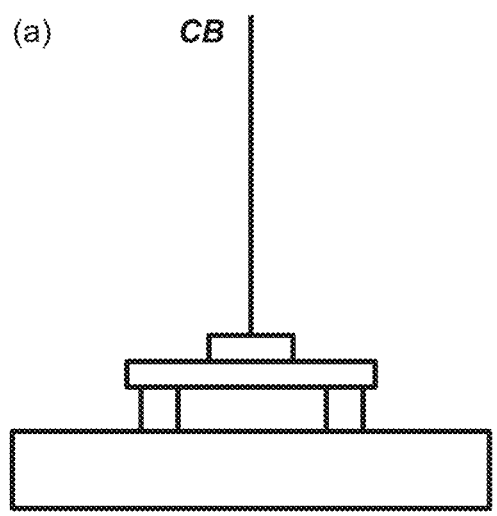
FIG. 6 is a diagram used for describing a method in which an incident direction of a charged particle beam is inclined by a predetermined angle with respect to a sample by tilting a sample stage.
Figure 6:
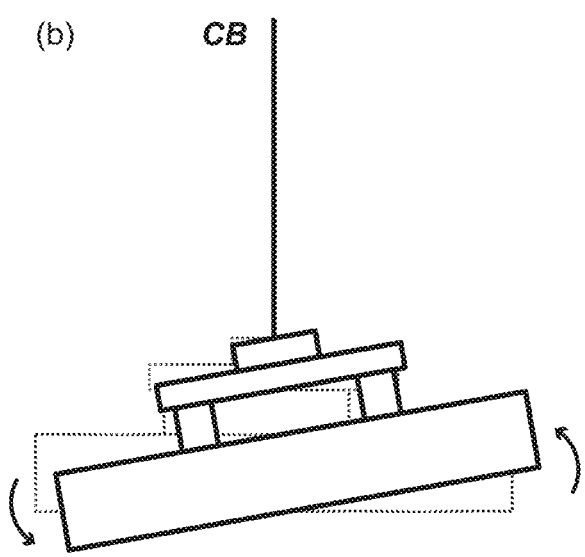

In a case where the incident direction of the charged particle beam with respect to the sample is controlled by the sample stage changing the tilting direction and the tilting value of the sample according to the instruction given from the tilting angle adjusting unit 6, no special limitation is provided on how to change the tilting direction and the tilting value of the sample. As illustrated in FIG. 6, the incident direction may be controlled by using a driving mechanism of the sample stage in combination, the drive mechanism being incorporated in a general-purpose charged particle beam device 100, or use may be made of a sample stage including a mechanism disclosed in Patent Literature 1 or Patent Literature 2.

Figure 7:
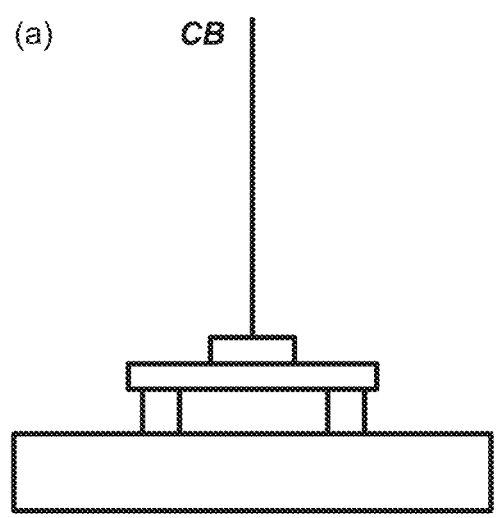
FIG. 7 is a diagram used for describing a method in which an incident direction of a charged particle beam is changed with respect to a sample by changing a position at which the charged particle beam is emitted, with an irradiated position of the charged particle beam on a sample surface being fixed.
Figure 7:
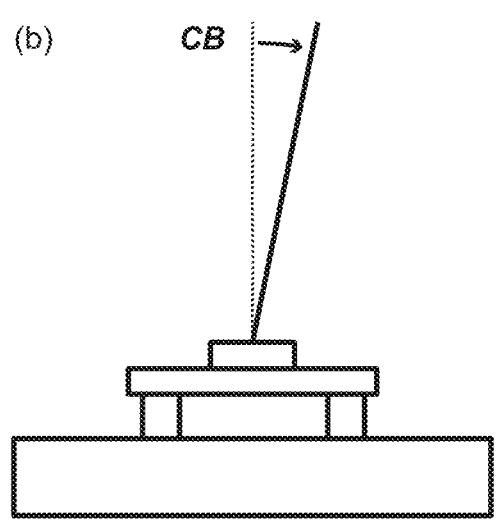
Figure 8:
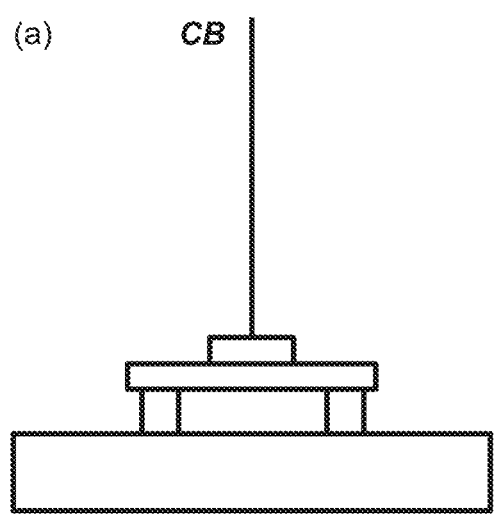
FIG. 8 is a diagram used for describing a method in which an incident direction of a charged particle beam is changed with respect to a sample by moving the sample in a predetermined direction, with an irradiated position of the charged particle beam on a sample surface being fixed.
Figure 8:
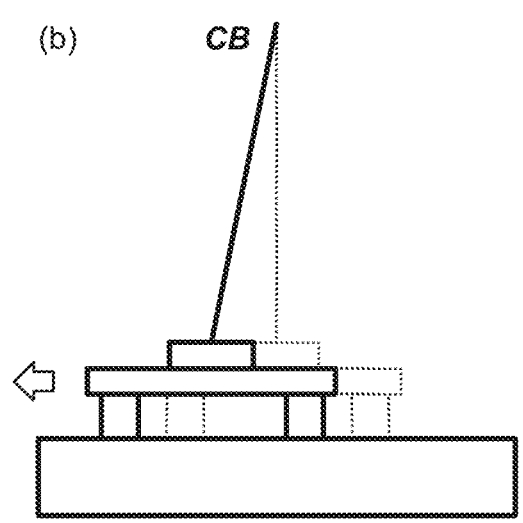

In a case where the incident direction of the charged particle beam with respect to the sample is controlled by the charged particle beam device 100 changing the incident direction of the charged particle beam according to the instruction given from the tilting angle adjusting unit 6, no special limitation is provided on how to change the tilting direction and the tilting value of the charged particle beam. For example, as illustrated in FIG. 7, the tilting direction and the tilting value of the charged particle beam can be changed by changing a position for emitting the charged particle beam with an irradiated position of the charged particle beam on the sample surface fixed. For example, as illustrated in FIG. 8, the tilting direction and the tilting value of the charged particle beam can be changed also by moving the sample stage incorporated in the charged particle beam device 100 with the irradiated position of the charged particle beam on the sample surface fixed.

Note that when the tilting parameters calculating device 10 including the rotation axis setting unit 4 and the tilting parameters adjusting unit 6, an order of the setting of the two rotation axes by the rotation axis setting unit 4, the calculation of the tilting parameters by the tilting parameters calculating unit 3, and the adjustment of the tilted state by the tilting angle adjusting unit 6 does not matter. For example, instruction may be given to the sample stage or the charged particle beam device 100 such that the rotation axis setting unit 4 sets the α axis and the β axis, the tilting parameters calculating unit 3 then calculates rotation angles about the α axis and the β axis, respectively, and the tilting angle adjusting unit 6 adjusts the tilted state about the α axis and the β axis.

Alternatively, instruction may be given to the sample stage or the charged particle beam device 100 such that the rotation axis setting unit 4 sets the α axis, the tilting parameters calculating unit 3 then calculates the rotation angle about the α axis, and the tilting angle adjusting unit 6 then adjusts the tilted state about the α axis, and subsequently, instruction may be given to the sample stage or the charged particle beam device 100 such that the rotation axis setting unit 4 sets the β axis, the tilting parameters calculating unit 3 then calculates the rotation angle about the β axis, and the tilting angle adjusting unit 6 then adjusts the tilted state about the β axis. In addition, the setting order of the α axis and the β axis may be inversed.

In addition, when the tilting parameters calculating device 10 includes the rotation axis setting unit 4 and the output unit 5, the output unit 5 may acquire information relating to the crystal orientation figure and the direction of at least one of the α axis and the β axis.

The output unit 5 may output the acquired crystal orientation figure, and at least one of lines indicating the α axis and the β axis (hereinafter, a line indicating a rotation axis will be referred to as an "axis") or at least one of lines indicating rotation directions of the crystal (hereafter, a line indicating a rotation direction will be also referred to as a "direction line") when the α axis and the β axis serve as rotation centers (hereafter, a rotation direction about the α axis will be also referred to as an "α direction", and a rotation direction about the β axis will be also referred to as a "β direction") so that the figure and line are displayed on the external display device at the same time.

At this time, the crystal orientation figure, and the axes or the direction lines are output to one display device; alternatively, the crystal orientation figure may be output to one display device, and the axes or the direction lines may be output to another display device. Alternatively, in a case where they are output to one display device, the crystal orientation figure, and the axes or the direction lines may be displayed in a tiled manner or in an overlapped manner.

In a case where the tilting parameters calculating device 10 includes the output unit 5 and the tilting angle adjusting unit 6, and the incident direction of the charged particle beam with respect to the sample is changed according to the instruction given from the tilting angle adjusting unit 6, the output unit 5 may further acquire a charged particle beam image of the sample surface corresponding to the changed incident direction, the charged particle beam image being measured by the charged particle beam device, and output the charged particle beam images, and the crystal orientation figures of the crystal A and/or the designated crystal orientation figures corresponding to the incident direction in the standard status and/or the changed incident direction such that the images and figures are displayed on the external display device at the same time.

In a case where the crystal orientation figure creating unit 2 also creates a crystal orientation figure of the crystal B, the output unit 5 may further acquire the crystal orientation figure of the crystal B and/or the designated crystal orientation figure of the crystal B, and may output the charged particle beam images, and the crystal orientation figures of the crystal A and/or the designated crystal orientation figures of the crystal A, as well as the crystal orientation figures of the crystal B and/or the designated crystal orientation figures of the crystal B with the incident direction in the standard status and/or the changed incident direction so that they are displayed at the same time.

[Configuration of Sample Stage]

A sample stage according to an embodiment of the present invention has a configuration that enables the tilting direction and the tilting value of the sample to be changed according to the instruction given from the tilting angle adjusting unit 6. The sample stage may be incorporated in the charged particle beam device or installed externally. In addition, a sample stage incorporated in the charged particle beam device and a sample stage installed externally may be combined together.

[Configuration of Charged Particle Beam Device]

The charged particle beam device 100 according to an embodiment of the present invention includes the tilting parameters calculating device 10 and a main body 20, and has a configuration that allows the main body 20 to change the tilting direction and the tilting value of the charged particle beam with respect to the sample according to the instruction given from the tilting angle adjusting unit 6. In addition, the charged particle beam device 100 according to another embodiment of the present invention includes the sample stage described above.

In addition, the charged particle beam device 100 according to another embodiment of the present invention includes the tilting parameters calculating device 10 and the main body 20, has a configuration that allows the main body 20 to change the tilting direction and the tilting value of the charged particle beam with respect to the sample according to the instruction given from the tilting angle adjusting unit 6, and includes the sample stage described above. The configuration of the charged particle beam device according to embodiments of the present invention including the tilting parameters calculating device will be described more specifically.

Figure 9:
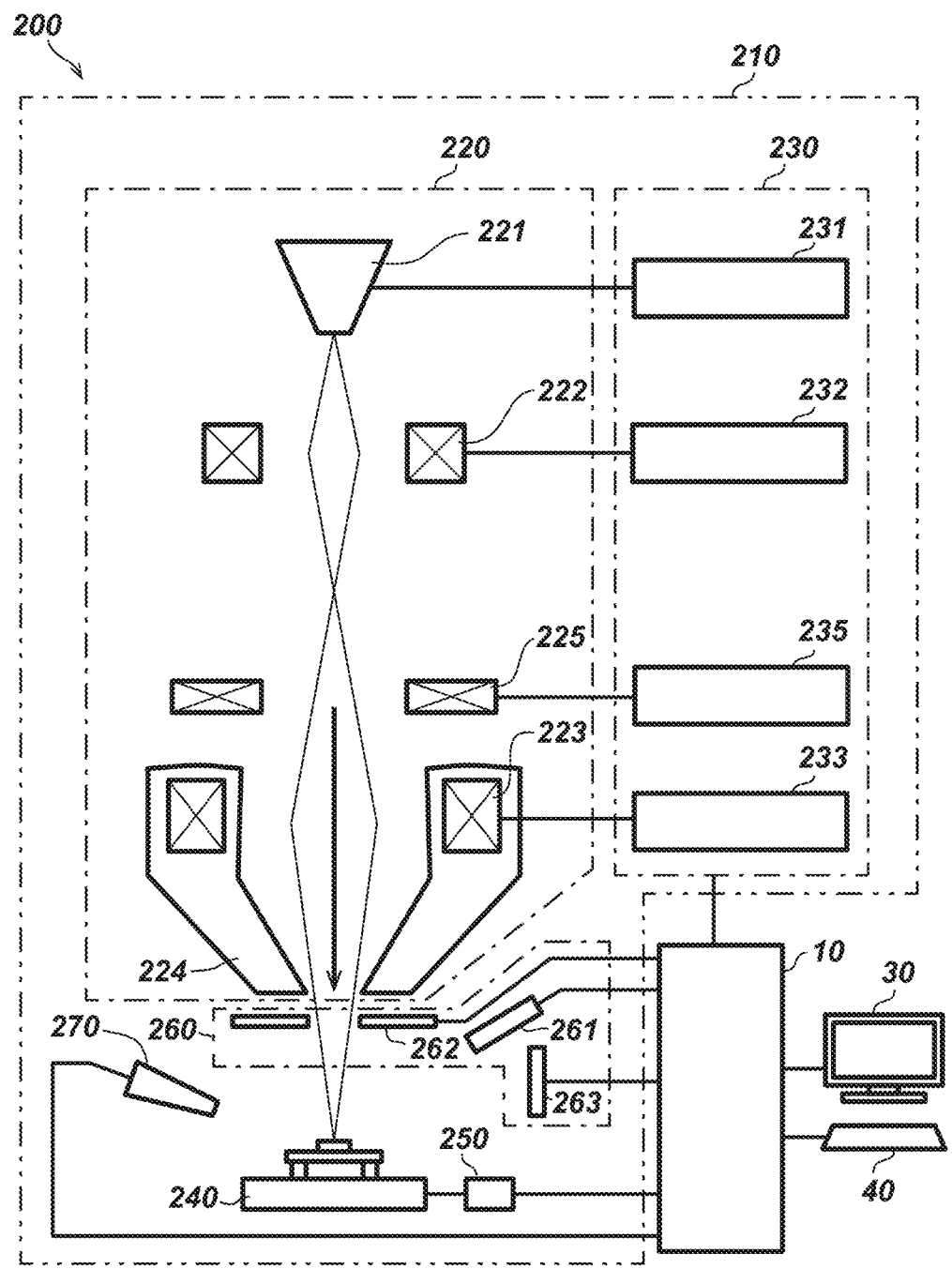
FIG. 9 is a diagram illustrating an example of an SEM schematically.

First, a case where an SEM 200 is used as the charged particle beam device 100 will be described as an example. FIG. 9 is a diagram illustrating an example of the SEM 200 schematically. As illustrated in FIG. 9, the SEM 200 includes the tilting parameters calculating device 10 and a main body 210. The main body 210 includes an electron beam irradiation device 220, an electron beam control device 230, a sample stage 240, a sample stage driving device 250, a detection device 260, and an FIB irradiation device 270.

The electron beam irradiation device 220 mainly includes an electron gun 221 configured to draw an electron beam from an electron source, and accelerate and emit the electron beam, a condenser lens 222 configured to focus an accelerated electron beam flux, an objective lens 223 configured to converge the focused electron beam flux within a micro region on the sample, a pole piece 224 including the objective lens, and a deflection coil 225 configured to scan the sample with the electron beam flux.

The electron beam control device 230 includes an electron gun control device 231, a focusing lens system control device 232, an objective lens system control device 233, and a deflection coil control device 235. The electron gun control device 231 is a device configured to control an acceleration voltage and the like for the electron beam emitted from the electron gun 221, and the focusing lens system control device 232 is a device configured to control a convergence angle and the like of the electron beam flux that is focused by the condenser lens 222.

The sample stage 240 is for holding a sample, and its tilting angle and a virtual three-dimensional-coordinate position can be freely changed by the sample stage driving device 250. The detection device 260 includes a secondary electron detector 261, a backscattered electron detector 262, and an electron backscatter diffraction (EBSD) detector 263.

The FIB irradiation device 270 is a device for irradiating an FIB to the sample. A known device can be employed for the FIB irradiation device 270, and detailed illustrations and description of a structure of the FIB irradiation device 270 will be omitted. As illustrated in FIG. 9, in a configuration in which the FIB irradiation device 270 is included in the SEM 200, the charged particle beam includes an electron beam irradiation from the electron beam irradiation device 220 and an FIB irradiation from the FIB irradiation device 270. In general, the incident direction of the FIB is inclined by 52°, 54°, or 90° with respect to the incident direction of the electron beam. The SEM 200 need not include the FIB irradiation device 270.

In the configuration, a charged particle beam image is obtained by the secondary electron detector 261 and the backscattered electron detector 262, and crystal orientation information is obtained by the electron backscatter diffraction detector 263.

Figure 10:
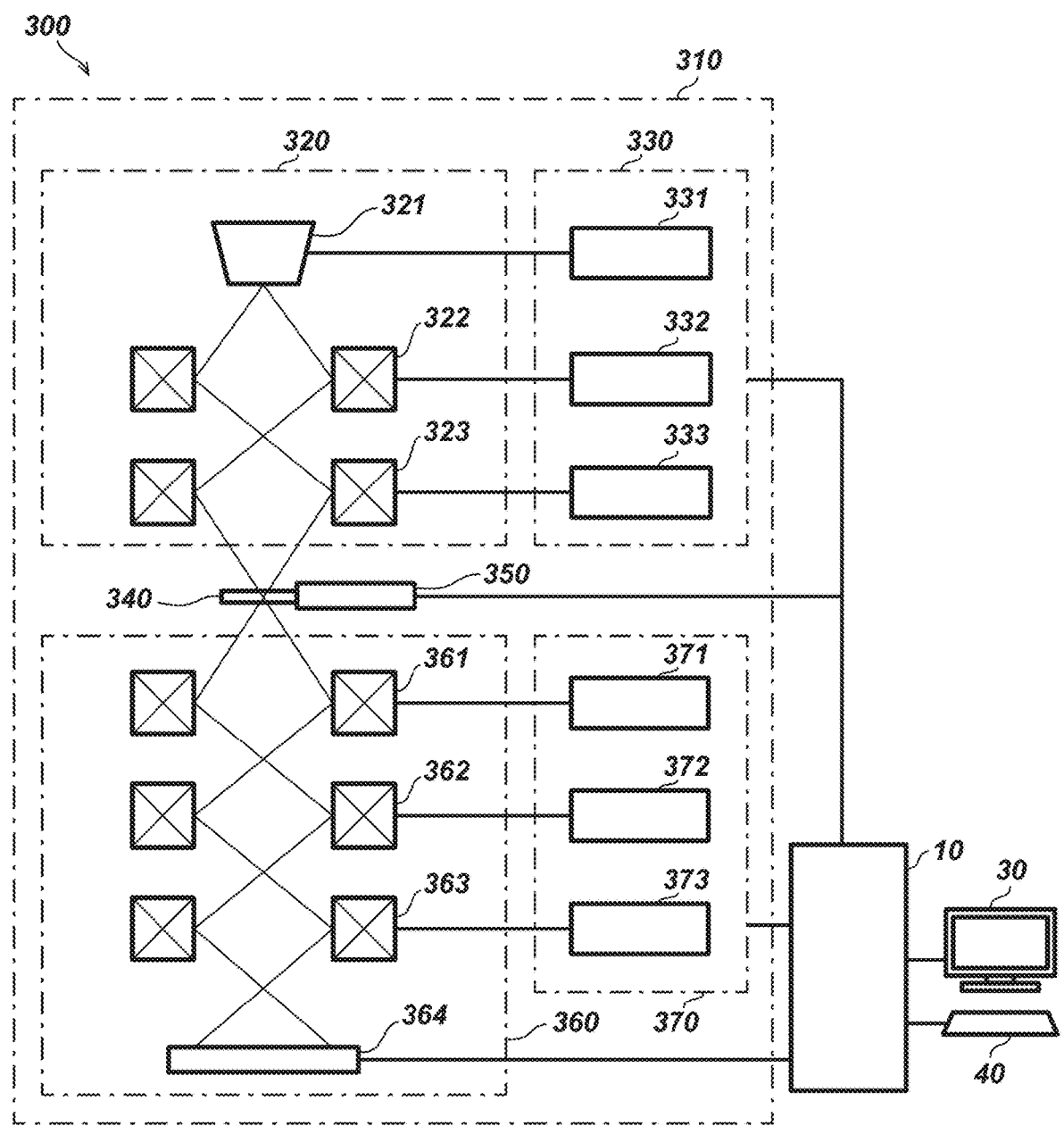
FIG. 10 is a diagram illustrating an example of a TEM schematically.

Next, a case where the charged particle beam device 100 is a TEM 300 will be described as an example. FIG. 10 is a diagram illustrating an example of the TEM 300 schematically. As illustrated in FIG. 10, a main body 310 of the TEM 300 includes an electron beam irradiation device 320, an electron beam control device 330, a sample holder 340, a sample holder driving device 350, a detection device 360, and a detection system control device 370.

The electron beam irradiation device 320 mainly includes an electron gun 321 configured to draw an electron beam from an electron source, and accelerate and emit the electron beam, a first condenser lens 322 and a second condenser lens 323 each configured to focus an accelerated electron beam flux.

The electron beam control device 330 includes an electron gun control device 331, a first condenser lens system control device 332, and a second condenser lens system control device 333. The electron gun control device 331 is a device configured to control an acceleration voltage of the electron beam emitted from the electron gun 321. The first condenser lens system control device 332 and the second condenser lens system control device 333 are devices configured to control a convergence angle and the like of the electron beam flux that is focused by the first condenser lens 322 and the second condenser lens 323, respectively.

The sample holder 340 is for holding a sample, and its tilting angle and a virtual three-dimensional-coordinate position can be freely changed by the sample holder driving device 350. The detection device 360 includes an objective lens 361, an intermediate lens 362, a projector lens 363, and a detector 364. The objective lens 361, the intermediate lens 362, and the projector lens 363 enlarges a transmission image and an electron diffraction pattern, which are projected to the detector 364.

The detection system control device 370 includes an objective lens control device 371, an intermediate lens control device 372, and a projector lens control device 373, which changes magnetic intensities of the objective lens 361, the intermediate lens 362, and the projector lens 363, respectively, so that the information input into the detector 364 can be switched between the transmission image and the electron diffraction pattern.

In the configuration, a charged particle beam image and crystal orientation information are obtained by detector 364.

Next, operation of the tilting parameters calculating device according to an embodiment of the present invention will be described with reference to FIGS. 11 to 41.

First Embodiment

Figure 11:
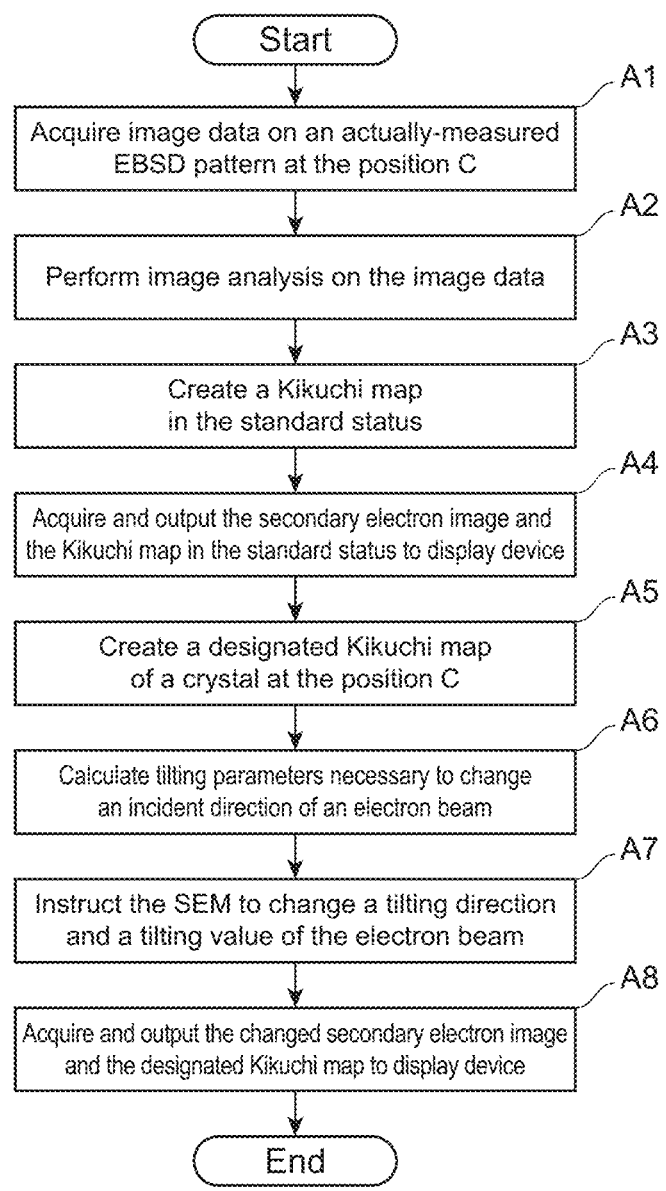
FIG. 11 is a flow chart illustrating operation of a tilting parameters calculating device according to a first embodiment of the present invention.

FIG. 11 is a flow chart illustrating operation of a tilting parameters calculating device according to a first embodiment of the present invention. In the embodiment to be described below, a case of using an SEM will first described as an example.

As a precondition, point analysis using the EBSD method is conducted at a position selected on a sample surface by an operator (hereafter, referred to as a "position C"). In the use of the EBSD method, the analysis needs to be conducted with the sample tilted by about 70° from the standard status. After the analysis, a tilting angle of the sample is returned to the standard status.

Subsequently, as illustrated in FIG. 11, the orientation information acquiring unit 1 acquires image data on an actually-measured EBSD pattern at the position C detected by the electron backscatter diffraction detector 263 (step A1). Then, the crystal orientation figure creating unit 2 performs image analysis on the image data (step A2).

Figure 12:
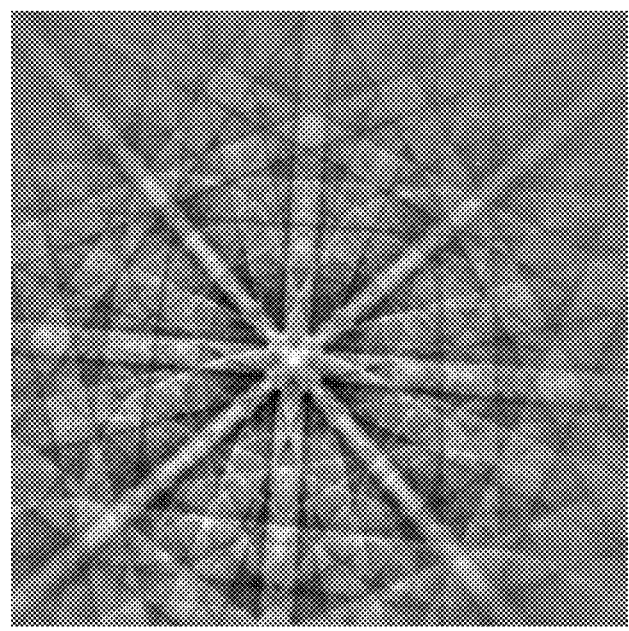
FIG. 12 is an image data on an EBSD pattern actually measured by an EBSD method.
Figure 13:
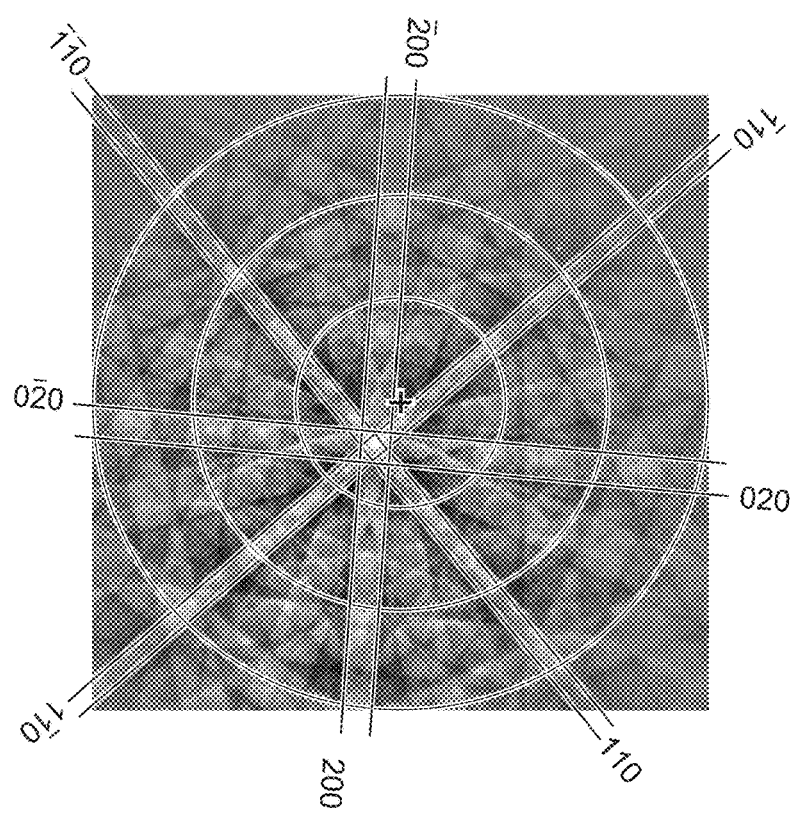
FIG. 13 is a diagram used for describing how to perform image analysis on image data on an EBSD pattern to generate a Kikuchi map.

FIG. 12 is image data on the EBSD pattern of a crystal lying at the position C obtained by the EBSD method. The crystal orientation figure creating unit 2 performs the image analysis on the image data on the actually-measured EBSD pattern, and identifies Kikuchi lines corresponding to crystal planes as illustrated in FIG. 13, so as to create a Kikuchi map (crystal orientation figure) in the standard status as illustrated in FIG. 14 (step A3).

Subsequently, the output unit 5 acquires the secondary electron image in the standard status measured by the SEM 200 and the Kikuchi map in the standard status created in step A3, and outputs the image and map such that the image and map are displayed at the same time on a display device 30 that is connected to the tilting parameters calculating device 10 (step A4).

Figure 14:
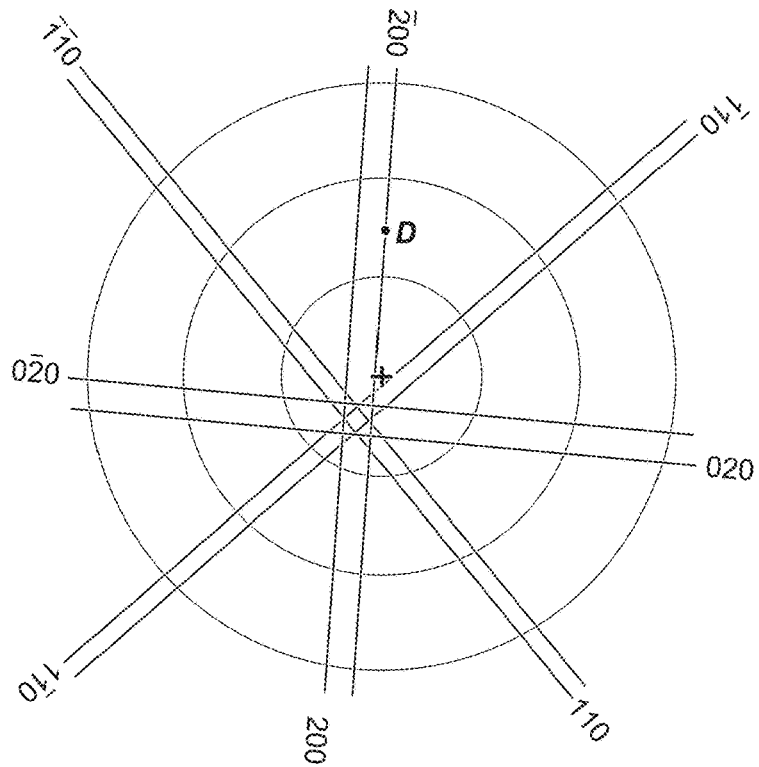
FIG. 14 is a diagram illustrating an example of a Kikuchi map in a standard status schematically.
Figure 15:
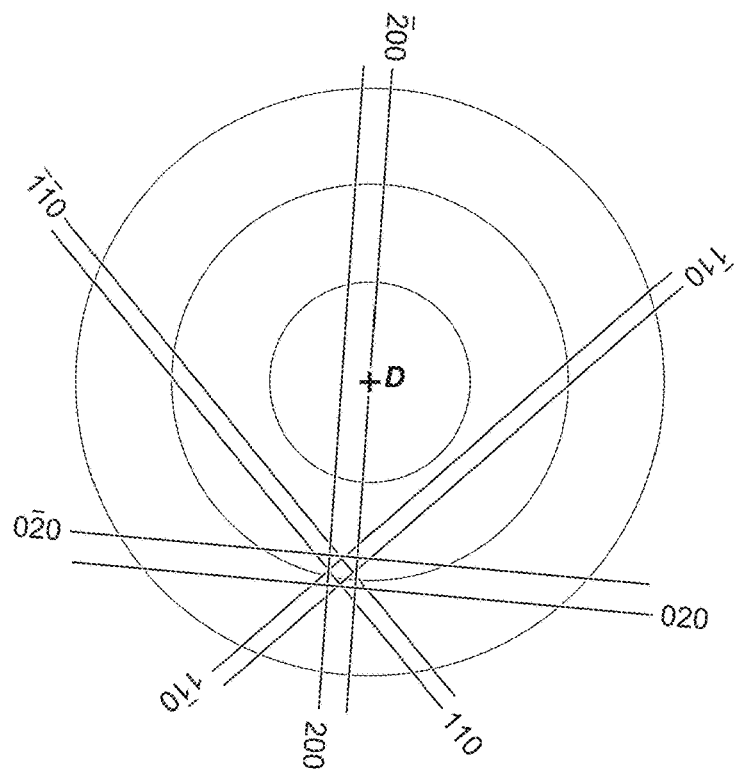
FIG. 15 is a diagram illustrating an example of a designated Kikuchi map schematically.

Thereafter, observing the Kikuchi map displayed on the display device 30, an operator designates a point D on the Kikuchi map such that the point D illustrated in FIG. 14 lies at a center of the Kikuchi map, and then the crystal orientation figure creating unit 2 creates a designated Kikuchi map of a crystal at the position C as illustrated in FIG. 15, based on information designated on the crystal orientation figure (step A5). The designation of the point lying at the center can be performed by input instructions from an input device 40 connected to the tilting parameters calculating device 10.

Next, the tilting parameters calculating unit 3 calculates tilting parameters necessary to change an incident direction of an electron beam with respect to the sample, based on the designated information (step A6). Subsequently, the tilting angle adjusting unit 6 instructs the SEM 200 to change a tilting direction and a tilting value (tilting angle depended on an axis line) of the electron beam with respect to the sample, based on the tilting parameters calculated in step A6 (step A7).

Specifically, the tilting angle adjusting unit 6 instructs the sample stage driving device 250 to move the sample stage 240 in a predetermined direction and instructs the electron beam control device 230 included in the SEM 200 to cause an irradiated position of the electron beam on the sample surface to follow the movement of the sample stage 240.

That is, the incident direction of the electron beam with respect to the sample is changed by controlling the sample stage driving device 250 and the electron beam control device 230 to move the sample in the predetermined direction with the irradiated position of the electron beam on the sample surface fixed as illustrated in FIG. 8.

After the incident direction of the electron beam with respect to the sample is changed, the output unit 5 acquires a designated Kikuchi map, as well as a secondary electron image corresponding to the changed incident direction, the secondary electron image measured by the SEM 200, and outputs the map and image such that the map and image are displayed at the same time on the display device 30 (step A8).

The designated Kikuchi map and the secondary electron image in a state where the Kikuchi map is created are thereby displayed at the same time on the display device 30. The acquisition of the secondary electron image and the output of the secondary electron image to the display device 30 may be performed every time the incident direction is changed, according to an instruction given from an operator, every predetermined interval, or continuously all the time.

Similarly to the electron beam, an FIB irradiated from the FIB irradiation device 270 can be used as the charged particle beam.

Second Embodiment

Figure 16:
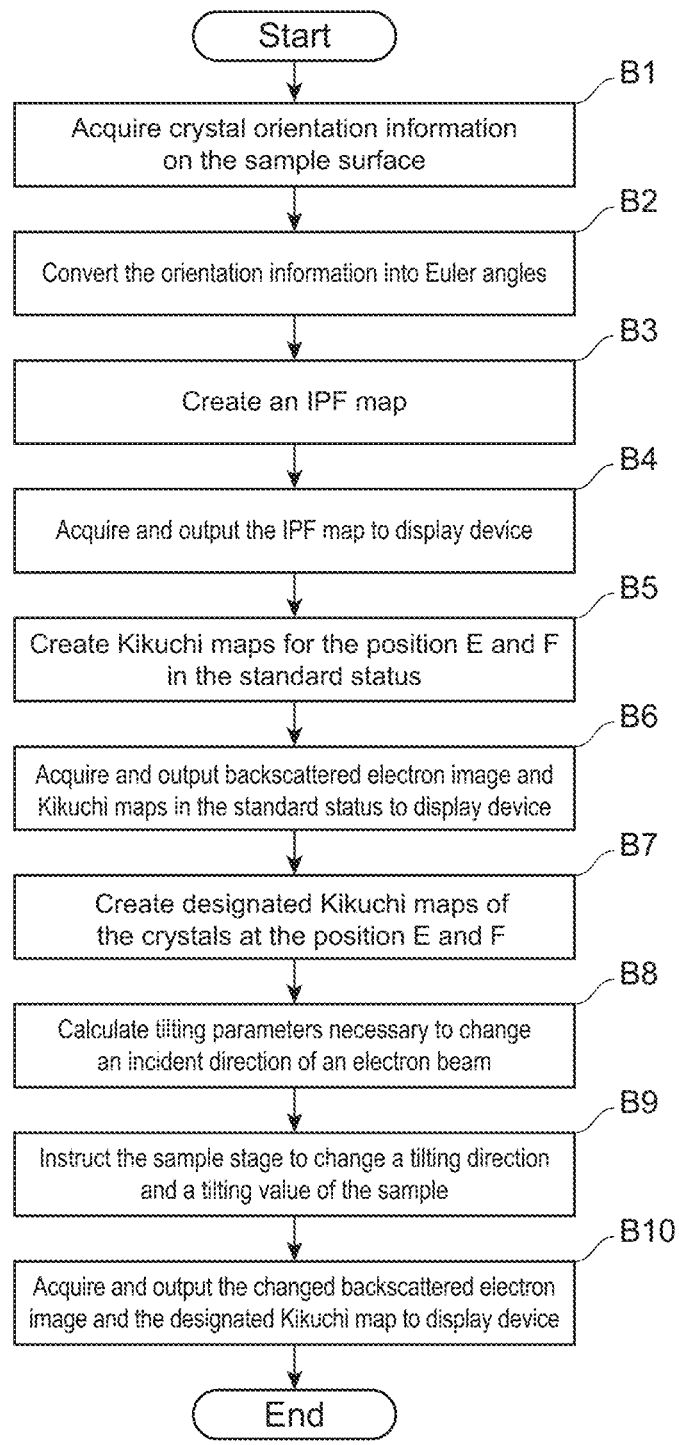
FIG. 16 is a flow chart illustrating operation of a tilting parameters calculating device according to a second embodiment of the present invention.

In addition, operation of a tilting parameters calculating device according to a second embodiment of the present invention will be described more specifically with reference to FIG. 16. FIG. 16 is a flow chart illustrating the operation of the tilting parameters calculating device according to the second embodiment of the present invention.

As a precondition, mapping analysis using the EBSD method is conducted for a predetermined region on a sample surface. Subsequently, as illustrated in FIG. 16, the orientation information acquiring unit 1 acquires crystal orientation information on the sample surface detected by the electron backscatter diffraction detector 263 (step B1) and converts the orientation information into Euler angles with respect to a virtual orthogonal coordinate system on the sample surface (step B2).

Figure 17:
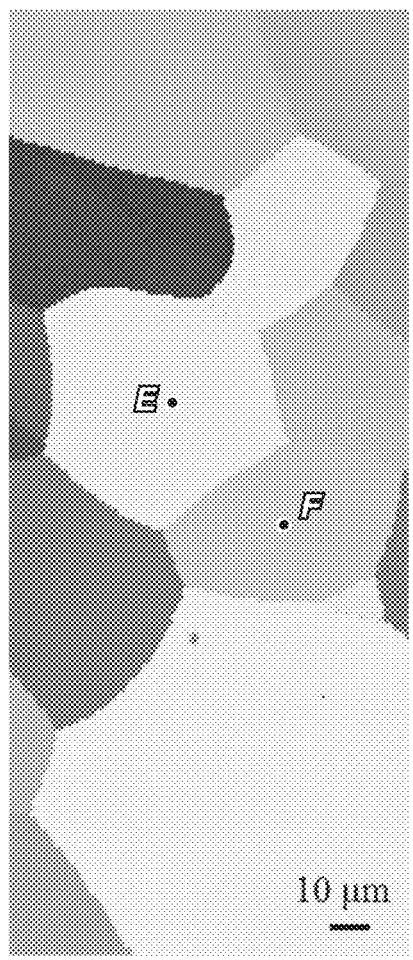
FIG. 17 is a diagram illustrating an example of an IPF map.
Figure 18:
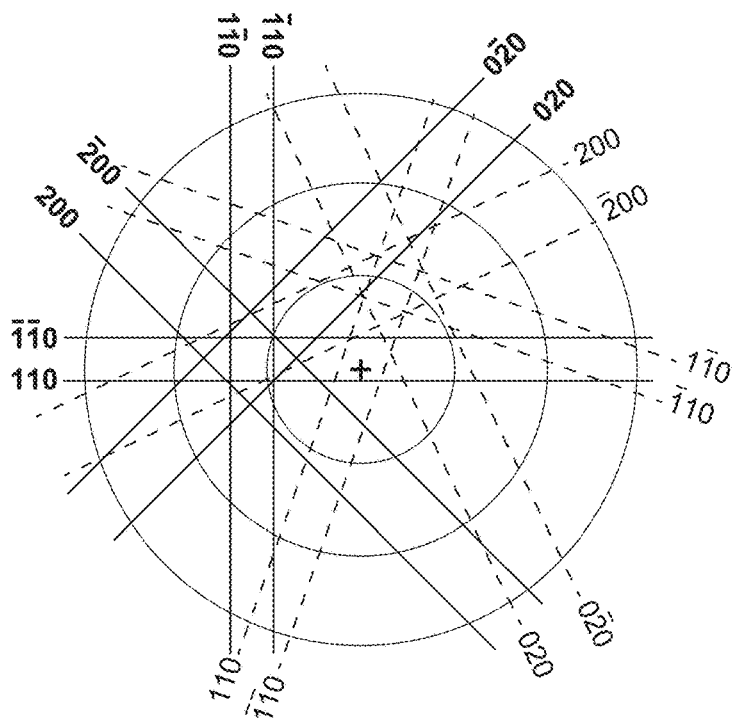
FIG. 18 is a diagram illustrating an example of two Kikuchi maps in a standard status schematically.

Subsequently, the crystal orientation figure creating unit 2 creates an IPF map as illustrated in FIG. 17, based on the orientation information converted into the Euler angles (step B3). The output unit 5 then acquires the created IPF map and outputs the IPF map to the display device 30 (step B4). Then, at positions selected on the IPF map by an operator (two positions indicated by black dots in FIG. 17, which hereafter will be referred to as a "position E" and a "position F"), the crystal orientation figure creating unit 2 creates two Kikuchi maps (crystal orientation figures) for the position E and the position F in the standard status as illustrated in FIG. 18, based on the orientation information converted into the Euler angles (step B5). As illustrated in FIG. 17, the position E and the position F lie in adjacent crystals.

Figure 19:
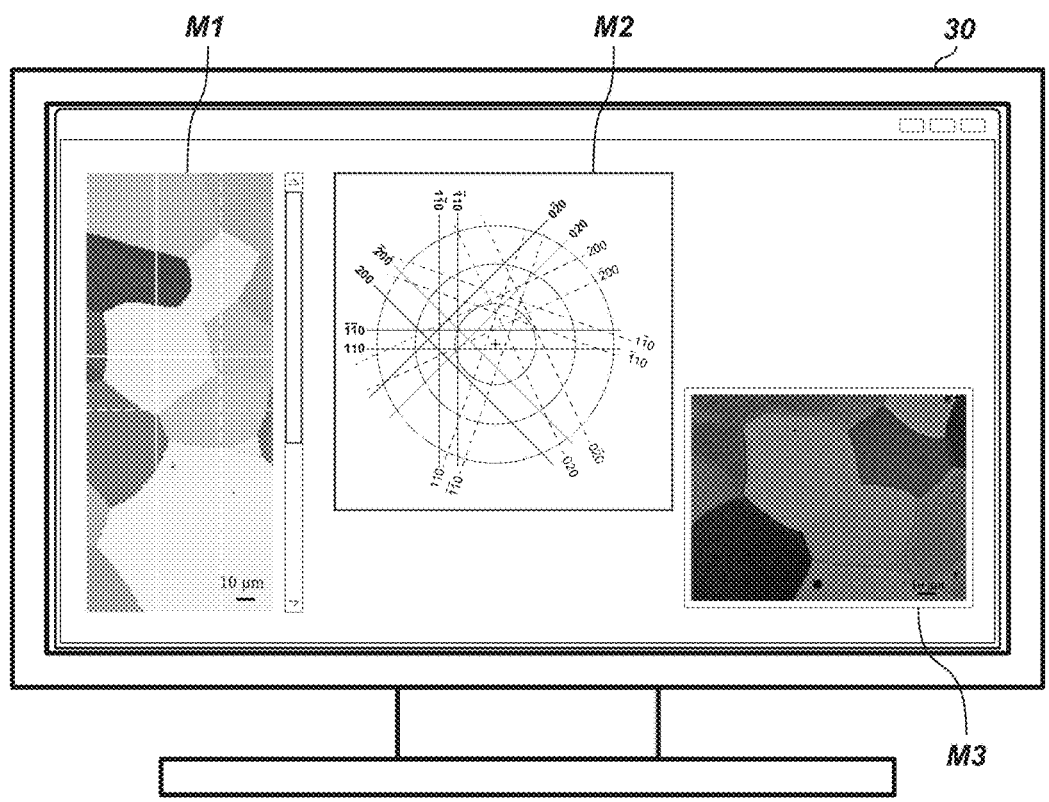
FIG. 19 is a diagram used for describing how an IPF map, as well as a backscattered electron image in a standard status and Kikuchi maps are displayed at the same time.

Subsequently, as illustrated in FIG. 19, the output unit 5 acquires an IPF map M1, as well as Kikuchi maps M2 in the standard status created in step B5 and a backscattered electron image M3 in the standard status measured by the SEM 200, and outputs the maps M1 and M2 and image M3 such that the maps M1 and M2 and image M3 are displayed at the same time on the display device 30 (step B6). In the present embodiment, two Kikuchi maps are displayed in an overlapped manner.

Figure 20:
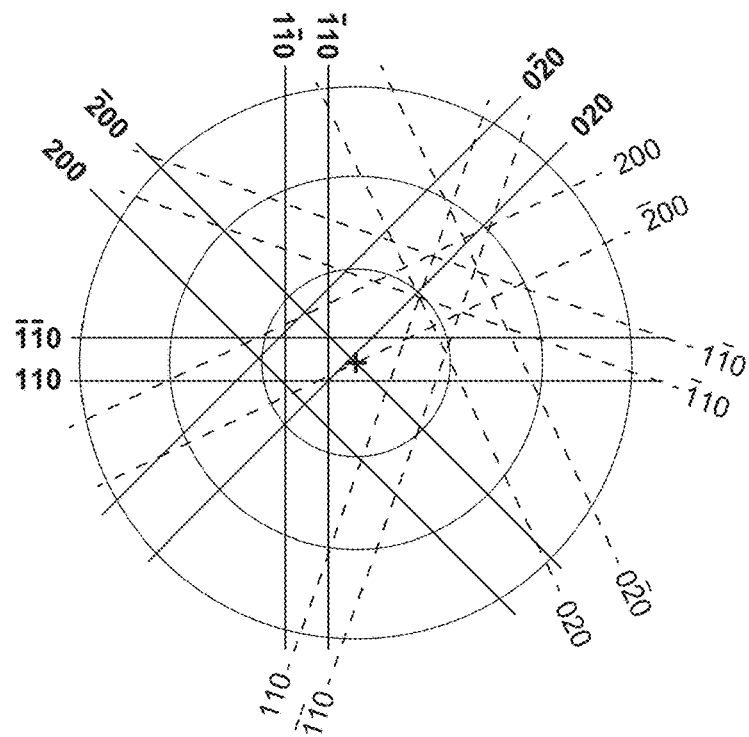
FIG. 20 is a diagram illustrating an example of two designated Kikuchi maps schematically.

Thereafter, observing the two Kikuchi maps displayed on the display device 30 in the overlapped manner, the operator designates an incident direction of an electron beam such that a channeling condition is satisfied for a (−200) plane included by both of the crystals at the position E and the position F. Following this, the crystal orientation figure creating unit 2 creates designated Kikuchi maps of the crystals at the position E and the position F as illustrated in FIG. 20, based on the information designated on the crystal orientation figures (step B7).

Next, the tilting parameters calculating unit 3 calculates tilting parameters necessary to change the incident direction of the electron beam with respect to the sample, based on the designated information (step B8). Subsequently, the tilting angle adjusting unit 6 instructs the sample stage 240 included in the SEM 200 to cause the sample stage driving device 250 to change the tilting direction and the tilting value of the sample, based on the tilting parameters calculated in step B8 (step B9).

Figure 21:
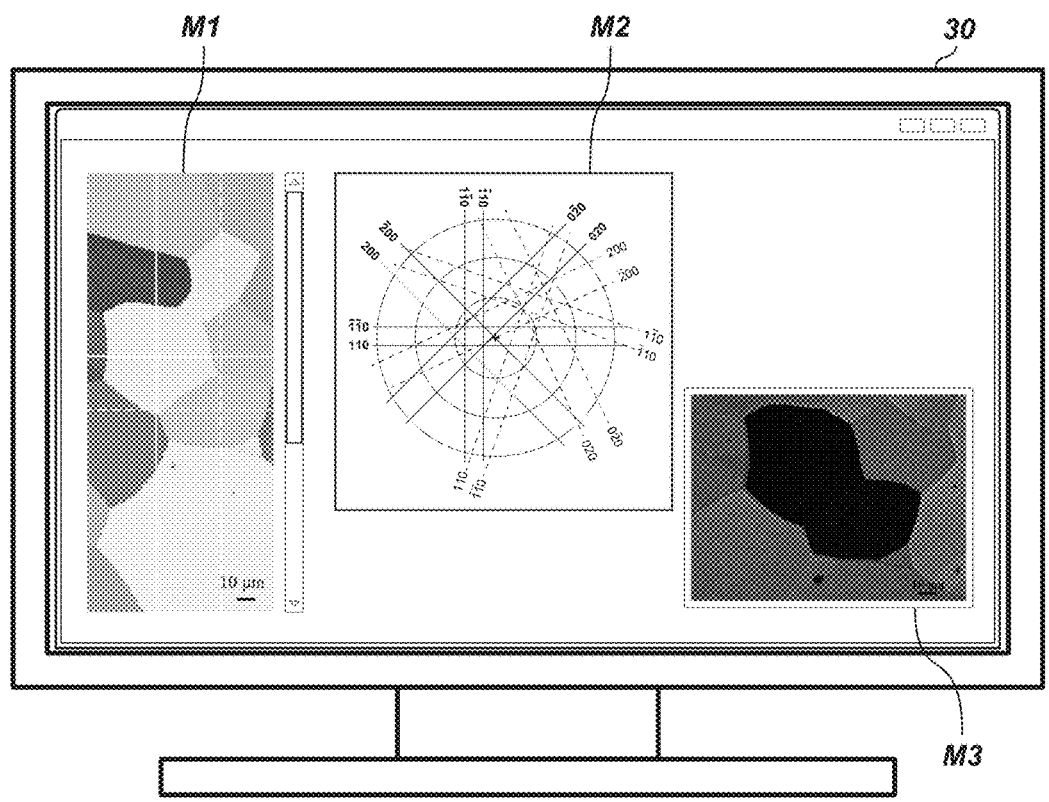
FIG. 21 is a diagram used for describing how an IPF map, a backscattered electron image in a changed incident direction, and designated Kikuchi maps are displayed at the same time.

After the incident direction of the electron beam with respect to the sample is changed, the output unit 5 acquires the IPF map M1, as well as the two designated Kikuchi maps M2 and the backscattered electron image M3 corresponding to the changed incident direction, the backscattered electron image M3 being measured by the SEM 200, and outputs the maps M1 and M2 and image M3 such that the maps M1 and M2 and image M3 are displayed at the same time on the display device 30, as illustrated in FIG. 21 (step B10). At this time, the crystal orientation figure creating unit 2 may create the IPF map corresponding to the changed incident direction over again, and the output unit 5 may acquire the new IPF map and cause the display device 30 to display the IPF map.

By performing the above steps, the backscattered electron image can be observed in a state where the incident direction of the electron beam satisfies the channeling condition for the (−200) plane included by both of the crystals at the position E and the position F. In this state, as illustrated in FIG. 21, a backscattered electron intensity is low in both crystals at the position E and the position F, and it is therefore possible to observe, for example, a dislocation that extends astride a boundary between two adjacent crystals.

How to control the incident direction of the electron beam with respect to the sample to determine which of crystal planes satisfies the channeling condition may be registered beforehand or may be input as appropriate by an operator looking at the crystal orientation figures. The input can be performed using the input device 40.

Third Embodiment

Figure 22:
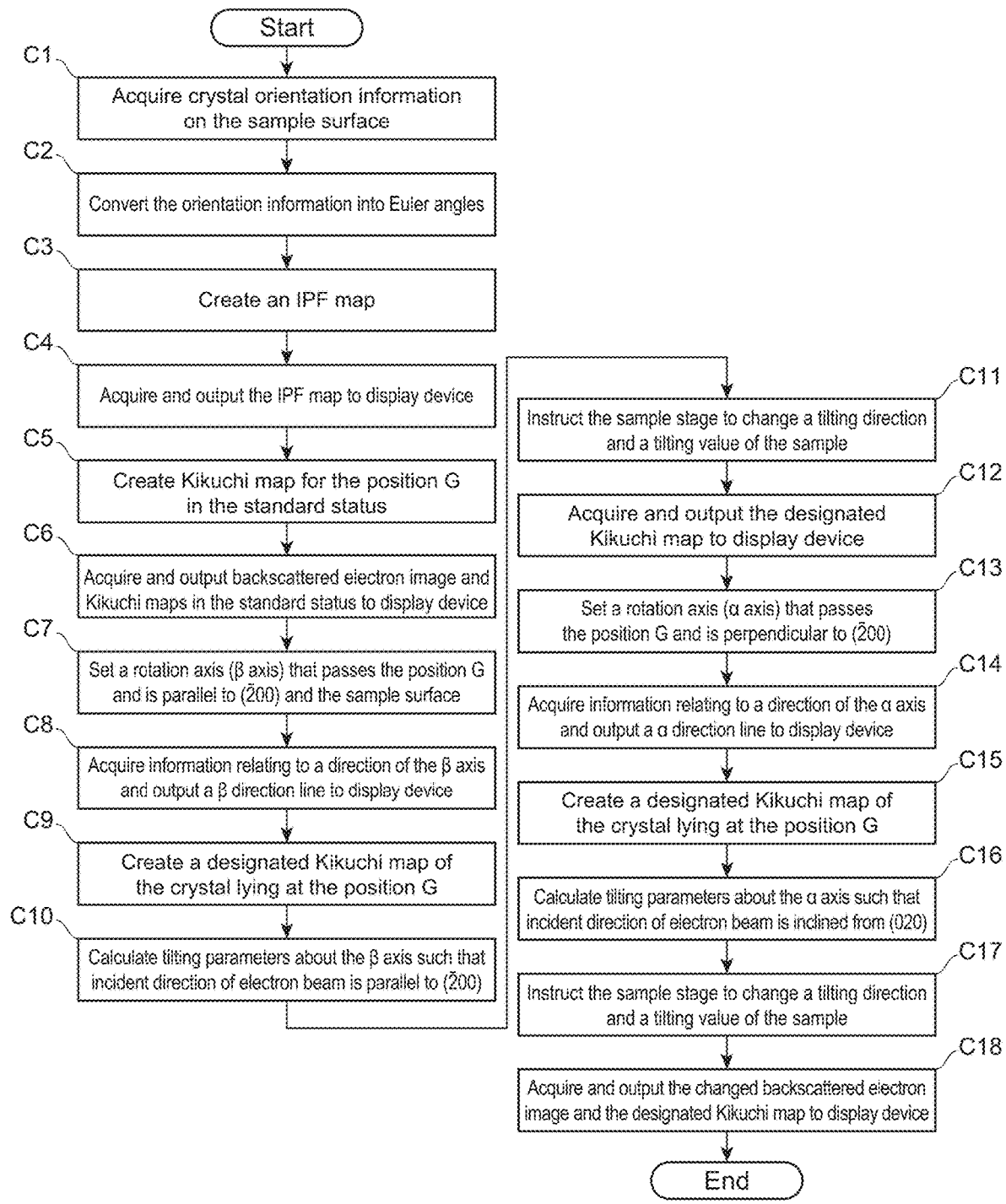
FIG. 22 is a flow chart illustrating operation of a tilting parameters calculating device according to a third embodiment of the present invention.

In addition, operation of a tilting parameters calculating device according to a third embodiment of the present invention will be described more specifically with reference to FIG. 22. FIG. 22 is a flow chart illustrating the operation of the tilting parameters calculating device according to the third embodiment of the present invention.

As a precondition, mapping analysis using the EBSD method is conducted for a predetermined region on a sample surface. Subsequently, as illustrated in FIG. 22, the orientation information acquiring unit 1 acquires crystal orientation information on the sample surface detected by the electron backscatter diffraction detector 263 (step C1) and converts the orientation information into Euler angles with respect to a virtual orthogonal coordinate system on the sample surface (step C2).

Figure 23:
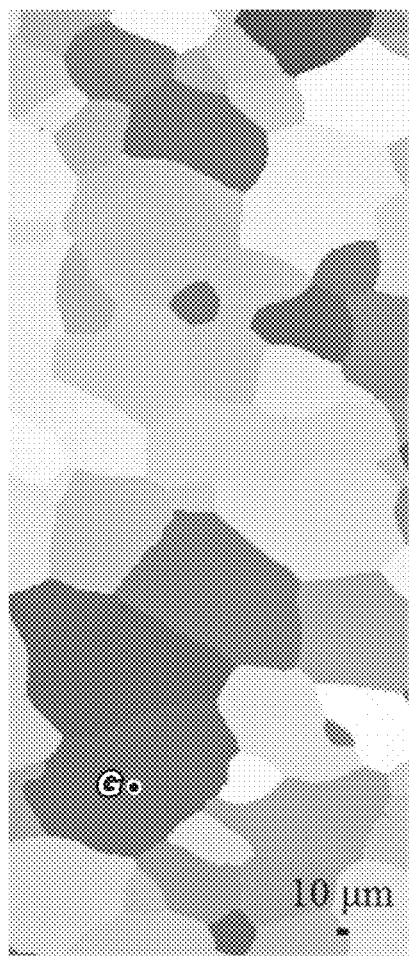
FIG. 23 is a diagram illustrating an example of an IPF map.

Subsequently, the crystal orientation figure creating unit 2 creates an IPF map as illustrated in FIG. 23, based on the orientation information converted into the Euler angles (step C3). The output unit 5 then acquires the created IPF map and outputs the IPF map to the display device 30 (step C4). Then, at a position selected on the IPF map by an operator (a position indicated by a black dot in FIG. 23, which will be hereafter referred to as a "position G"), the crystal orientation figure creating unit 2 creates a Kikuchi map for the position G in the crystal standard status as illustrated in FIG. 24, based on the orientation information converted into the Euler angles (step C5).

Figure 25:
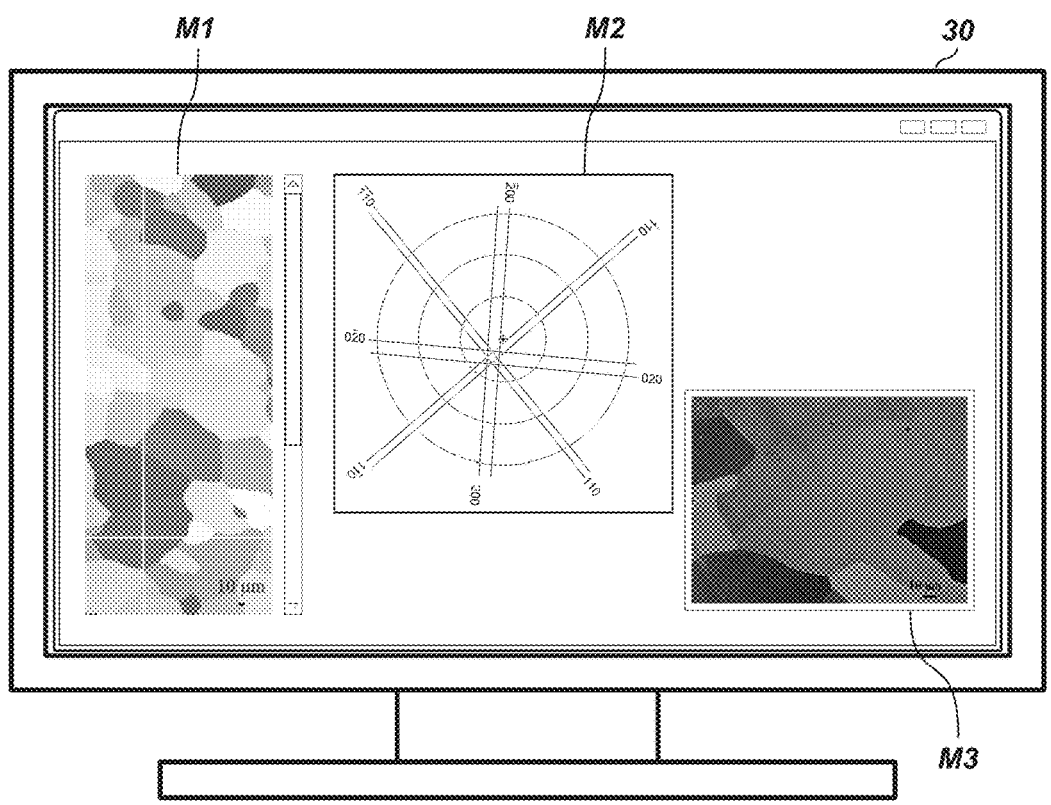
FIG. 25 is a diagram used for describing how an IPF map, as well as a backscattered electron image in a standard status and Kikuchi maps are displayed at the same time.

Subsequently, as illustrated in FIG. 25, the output unit 5 acquires an IPF map M1, as well as a Kikuchi map M2 in the standard status created in step C5 and a backscattered electron image M3 in the standard status measured by the SEM 200, and outputs the maps M1 and M2 and image M3 such that the maps M1 and M2 and image M3 are displayed at the same time on the display device 30 (step C6).

It is assumed in the present embodiment that an incident direction of an electron beam with respect to the sample is controlled such that the incident direction of the electron beam satisfies a channeling condition for a (−200) plane and points in a direction that is inclined from a (020) plane by a predetermined angle. How to control the incident direction of the electron beam may be registered beforehand but, in the present embodiment, is supposed to be selected as appropriate by an operator looking at the crystal orientation figure.

Figure 24:
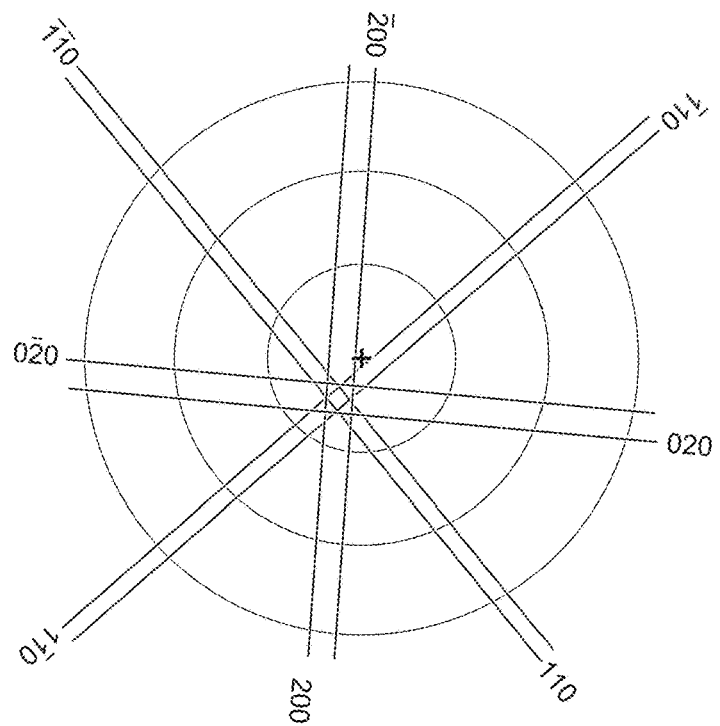
FIG. 24 is a diagram illustrating an example of a Kikuchi map in a standard status schematically.

Observing the Kikuchi map displayed on the display device 30, an operator selects a (0-20) plane, which is perpendicular to the (−200) plane illustrated in FIG. 24, and then the rotation axis setting unit 3 first sets an axis that passes the position G and is parallel to the (−200) plane and the sample surface as a rotation axis (hereafter, referred to as a "β axis") (step C7). The input can be performed using the input device 40 connected to the tilting parameters calculating device 10.

Figure 26:
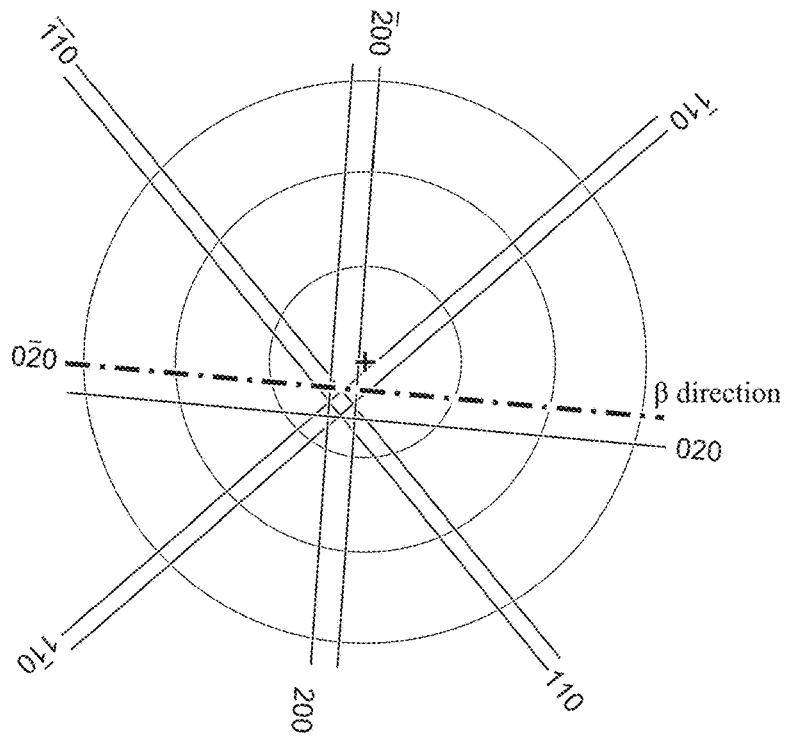
FIG. 26 is a diagram illustrating an example of a Kikuchi map in a standard status schematically.

Following this, the output unit 5 acquires information relating to a direction of the β axis and outputs a β direction line to the display device 30 such that the β direction line is superimposed on the Kikuchi map, as illustrated in FIG. 26 (step C8). A β axis is not displayed in the present embodiment but may be displayed at the same time. Then, the operator designates the incident direction of the electron beam such that the incident direction of the electron beam is parallel to the (−200) plane, and then the crystal orientation figure creating unit 2 creates a designated Kikuchi map of the crystal lying at the position G as illustrated in FIG. 27, based on the information designated on the crystal orientation figure (step C9).

Next, the tilting parameters calculating unit 3 calculates tilting parameters for the β direction about the β axis, based on the information designated on the crystal orientation figure (step C10). Subsequently, the tilting angle adjusting unit 6 instructs the sample stage 240 included in the SEM 200 to cause the sample stage driving device 250 to change the tilting direction and the tilting value of the sample, based on a result of the calculation in step C10 (step C11).

After the incident direction of the electron beam with respect to the sample is changed, the output unit 5 acquires the designated Kikuchi map and outputs the designated Kikuchi map to the display device 30 (step C12). As illustrated in FIG. 27, it is seen that the (−200) plane is parallel to the incident direction of the electron beam. At this time, the output unit 5 may acquire a backscattered electron image corresponding to the changed incident direction that is measured by the SEM 200 and cause the display device 30 to display the backscattered electron image at the same time.

Figure 27:
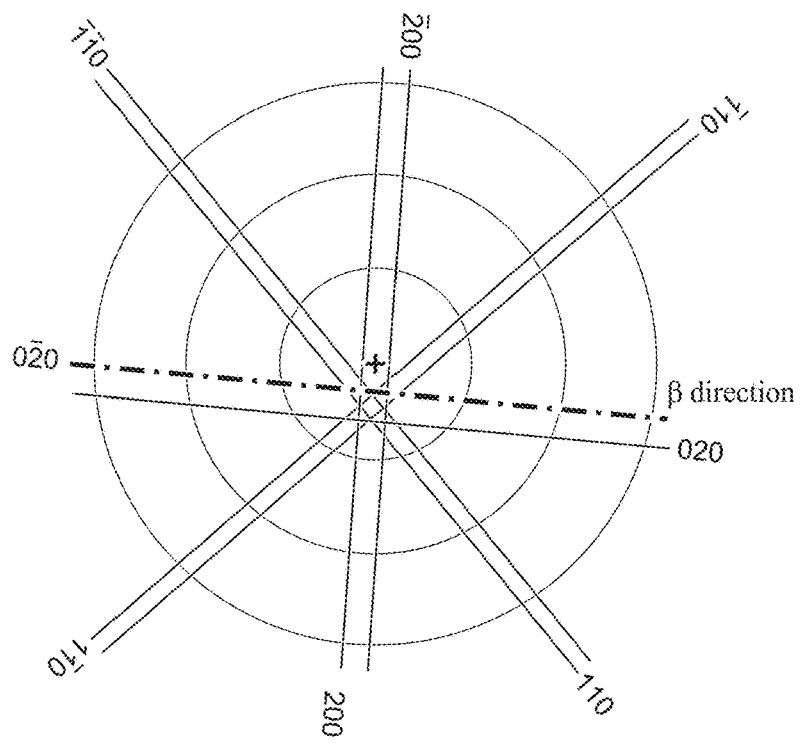
FIG. 27 is a diagram illustrating an example of a designated Kikuchi map schematically.

Thereafter, observing the Kikuchi map displayed on the display device 30, the operator selects the (−200) plane, which is perpendicular to the β direction illustrated in FIG. 27, and then the rotation axis setting unit 3 sets an axis that passes the position G and is perpendicular to the (−200) plane as a rotation axis (hereafter, referred to as an "α axis") (step C13).

Figure 28:
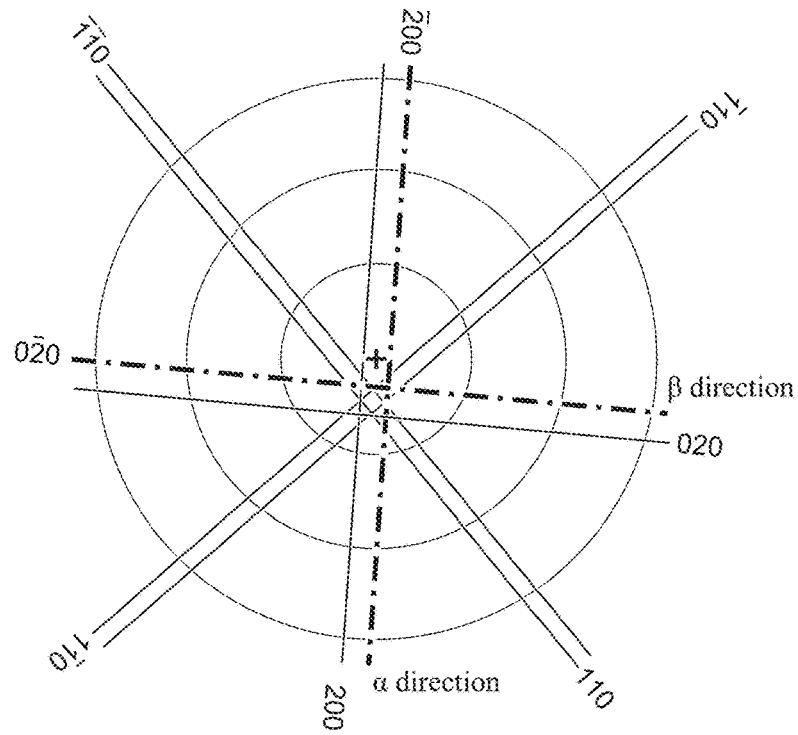
FIG. 28 is a diagram illustrating an example of a designated Kikuchi map schematically.
Figure 29:
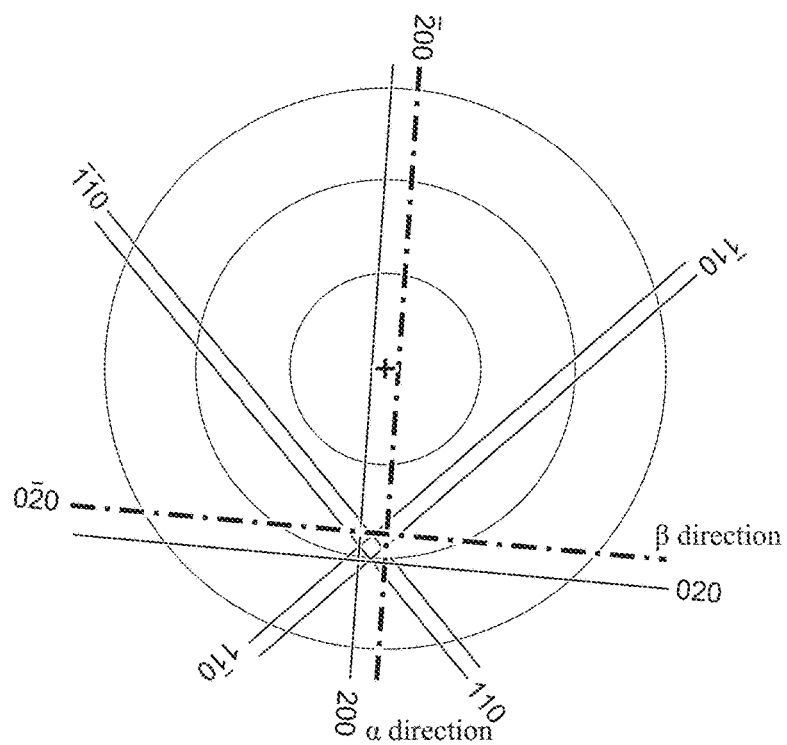
FIG. 29 is a diagram illustrating an example of a designated Kikuchi map schematically.

Following this, the output unit 5 acquires information relating to a direction of the α axis and outputs an α direction line to the display device 30 such that the α direction line is superimposed on the Kikuchi map, as illustrated in FIG. 28 (step C14). Then, the operator designates the incident direction of the electron beam such that the incident direction of the electron beam is inclined from the (020) plane by a predetermined angle while an angle of the incident direction with respect to the (−200) plane is unchanged, and then the crystal orientation figure creating unit 2 creates a designated Kikuchi map of the crystal lying at the position G as illustrated in FIG. 29, based on the information designated on the crystal orientation figure again (step C15).

Next, the tilting parameters calculating unit 3 calculates tilting parameters for the α direction about the α axis, based on the information designated on the crystal orientation figure (step C16). Subsequently, the tilting angle adjusting unit 6 instructs the sample stage 240 included in the SEM 200 to cause the sample stage driving device 250 to change the tilting direction and the tilting value of the sample, based on a result of the calculation in step C16 (step C17).

Figure 30:
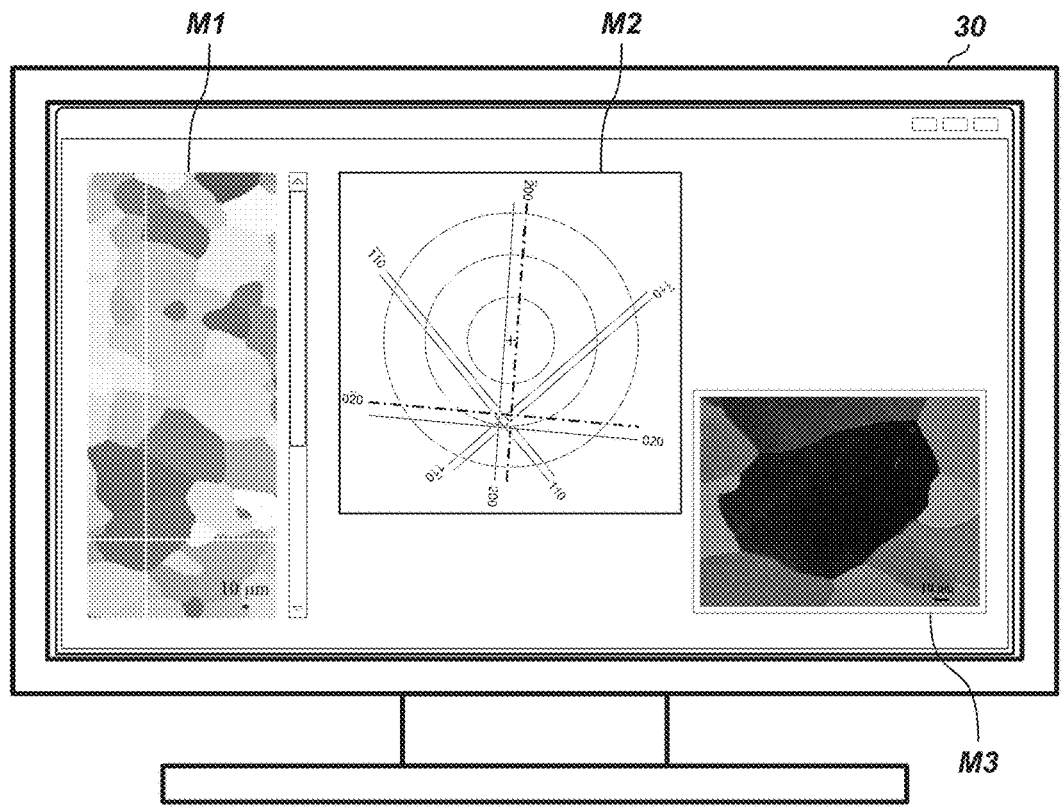
FIG. 30 is a diagram used for describing how an IPF map, a backscattered electron image in a changed incident direction, and designated Kikuchi maps are displayed at the same time.

After the incident direction of the electron beam with respect to the sample is changed, the output unit 5 acquires the IPF map M1, as well as the designated Kikuchi map M2 and the backscattered electron image M3 corresponding to the changed incident direction, the backscattered electron image M3 being measured by the SEM 200, and outputs the maps M1 and M2 and image M3 such that the maps M1 and M2 and image M3 are displayed at the same time on the display device 30, as illustrated in FIG. 30 (step C18).

Figure 31:
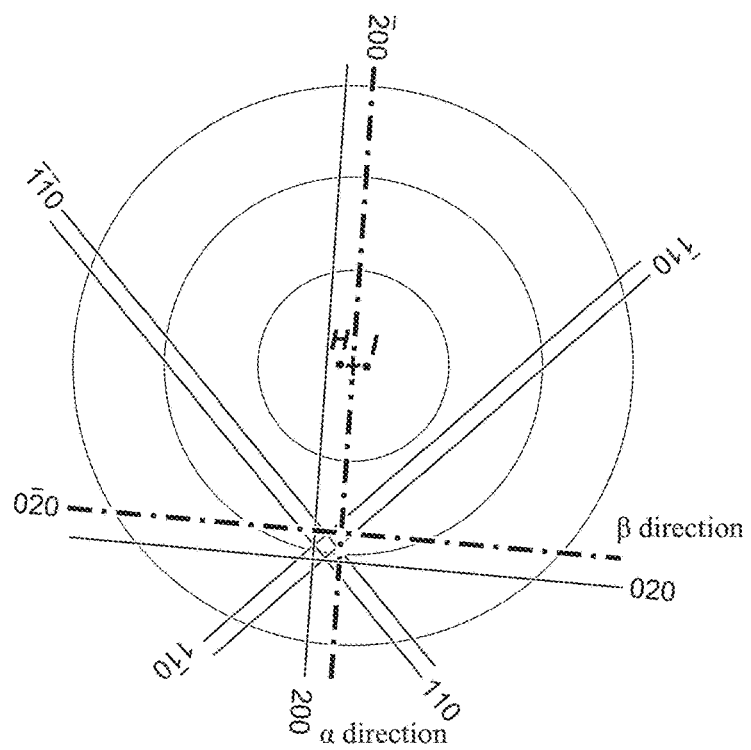
FIG. 31 is a diagram schematically illustrating an example of a Kikuchi map in a middle of being inclined about a β axis after being inclined about an α axis and the β axis.

Then, when the incident direction of an electron beam is moved from a point H to a point I illustrated in FIG. 31, a contrast of the backscattered electron intensity greatly varies about an axis parallel to the (−200) plane. To obtain a channeling condition that makes a contrast between a background and a lattice defect highest within the variation, it is preferable to measure the backscattered electron intensity with the incident direction of the electron beam with respect to the sample being moved from the point H to the point I in FIG. 31 around the β axis, and select a position where the backscattered electron intensity reaches its minimum.

Fourth Embodiment

Figure 32:
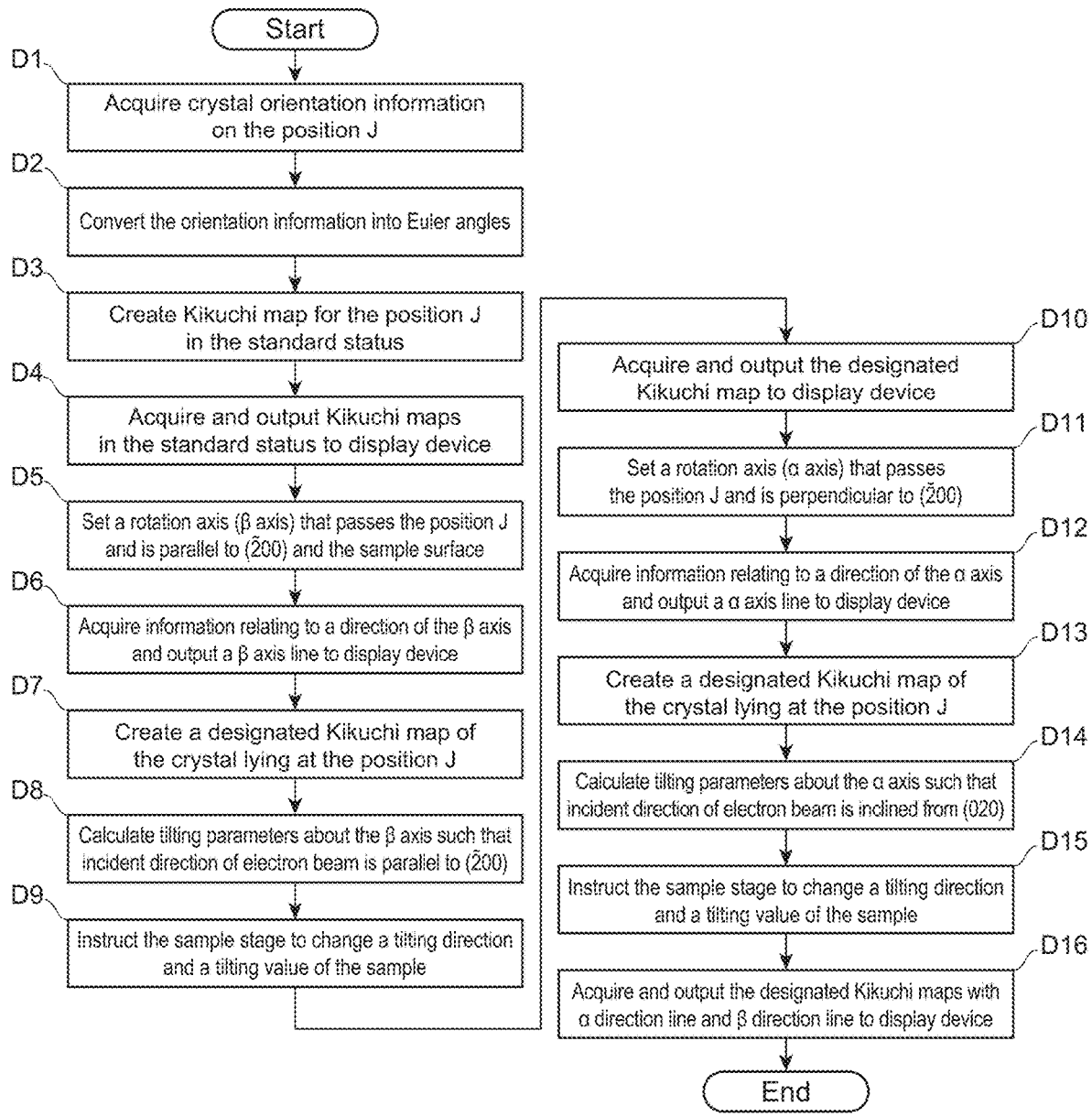
FIG. 32 is a flow chart illustrating operation of a tilting parameters calculating device according to a fourth embodiment of the present invention.

In addition, operation of tilting parameters calculating device according to a fourth embodiment of the present invention will be described more specifically with reference to FIG. 32. FIG. 32 is a flow chart illustrating the operation of the tilting parameters calculating device according to the fourth embodiment of the present invention.

As a precondition, point analysis using the EBSD method is conducted at a position selected on a sample surface by an operator (hereafter, referred to as a "position J"). Subsequently, as illustrated in FIG. 32, the orientation information acquiring unit 1 acquires crystal orientation information on the position J detected by the electron backscatter diffraction detector 263 (step D1) and converts the orientation information into Euler angles with respect to a virtual orthogonal coordinate system on the sample surface (step D2).

Figure 33:
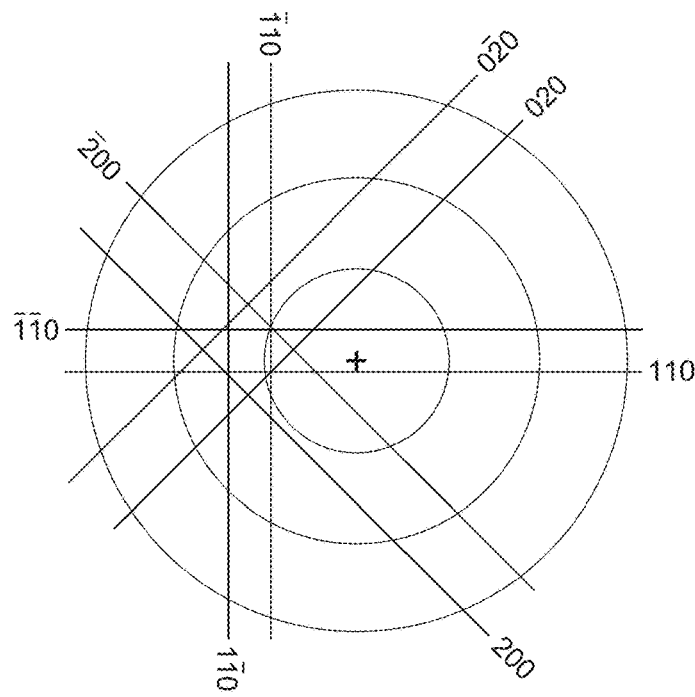
FIG. 33 is a diagram illustrating an example of a Kikuchi map in a standard status schematically.

Subsequently, the crystal orientation figure creating unit 2 creates a Kikuchi map of a crystal lying at the position J in the standard status as illustrated in FIG. 33, based on the orientation information converted into the Euler angles (step D3). The output unit 5 then acquires the created Kikuchi map and output the Kikuchi map to the display device 30 (step D4).

It is assumed in the present embodiment that an incident direction of an electron beam with respect to the sample is controlled such that the incident direction of the electron beam satisfies a channeling condition for a (−200) plane and points in a direction that is inclined from a (020) plane by a predetermined angle. How to control the incident direction of the electron beam may be registered beforehand but, in the present embodiment, is supposed to be selected as appropriate by an operator looking at the crystal orientation figure.

Observing the Kikuchi map displayed on the display device 30, an operator selects the (−200) plane illustrated in FIG. 33, and then the rotation axis setting unit 3 first sets an axis that passes the position J and is parallel to the (−200) plane and the sample surface as a rotation axis (hereafter, referred to as a "β axis") (step D5). The input can be performed using the input device 40 connected to the tilting parameters calculating device 10.

Figure 34:
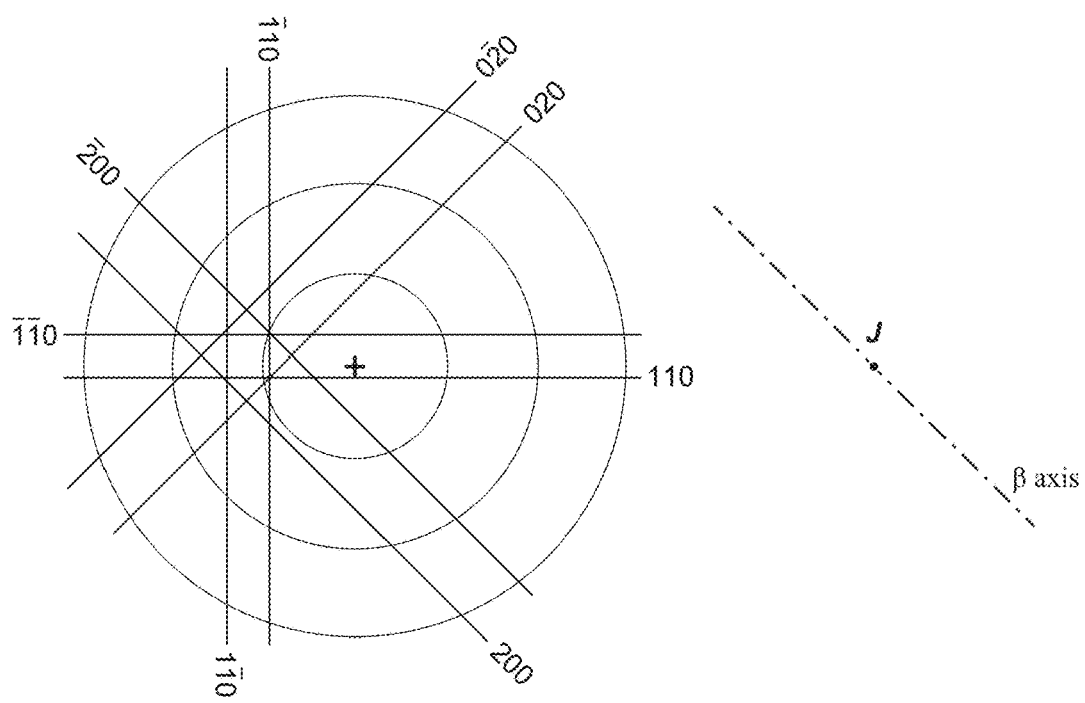
FIG. 34 is a diagram illustrating an example of a Kikuchi map in a standard status schematically.

Following this, the output unit 5 acquires information relating to a direction of the β axis and outputs a β axis to the display device 30 such that the β axis is juxtaposed to the Kikuchi map, as illustrated in FIG. 34 (step D6). A β direction line is not displayed in the present embodiment but may be displayed at the same time. Then, the operator designates the incident direction of the electron beam such that the incident direction of the electron beam is parallel to the (−200) plane, and then the crystal orientation figure creating unit 2 creates a designated Kikuchi map of the crystal lying at the position J as illustrated in FIG. 35 again, based on the information designated on the crystal orientation figure (step D7).

Next, the tilting parameters calculating unit 3 calculates tilting parameters about the β axis, based on the information designated on the crystal orientation figure (step D8). Subsequently, the tilting angle adjusting unit 6 instructs the sample stage 240 included in the SEM 200 to cause the sample stage driving device 250 to change the tilting direction and the tilting value of the sample, based on a result of the calculation in step D8 (step D9).

Figure 35:
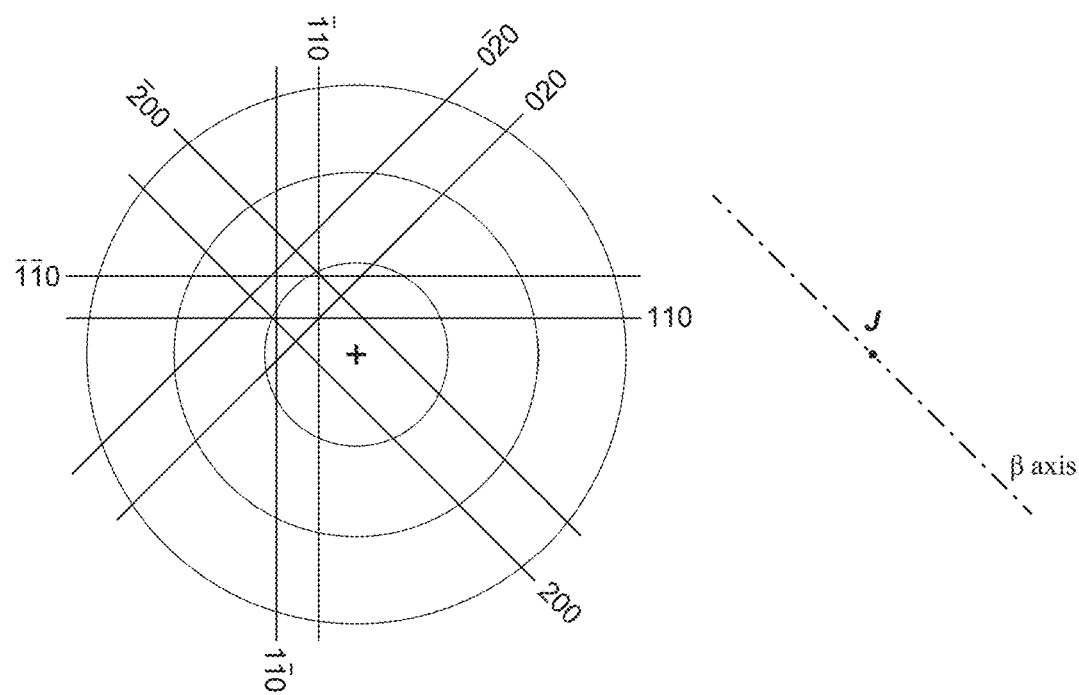
FIG. 35 is a diagram illustrating an example of a designated Kikuchi map schematically.

After the incident direction of the electron beam with respect to the sample is changed, the output unit 5 acquires the designated Kikuchi map and outputs the designated Kikuchi map to the display device 30 (step D10). As illustrated in FIG. 35, it is seen that the (−200) plane is parallel to the incident direction of the electron beam. At this time, the output unit 5 may acquire a backscattered electron image corresponding to the changed incident direction that is measured by the SEM 200 and cause the display device 30 to display the backscattered electron image at the same time.

Thereafter, observing the Kikuchi map displayed on the display device 30, the operator selects a direction perpendicular to the (−200) plane illustrated in FIG. 35, and then the rotation axis setting unit 3 sets an axis that passes the position J and is perpendicular to the (−200) plane as a rotation axis (hereafter, referred to as an "α axis") (step D11).

Figure 36:
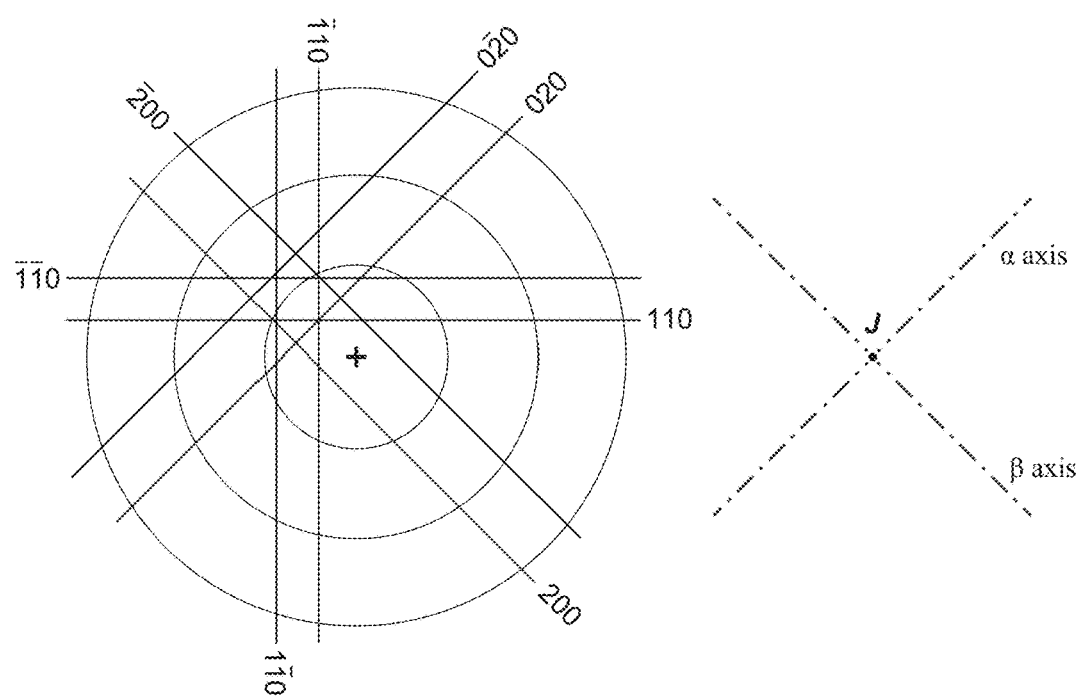
FIG. 36 is a diagram illustrating an example of a designated Kikuchi map schematically.

Following this, the output unit 5 acquires information relating to a direction of the α axis and outputs an α axis to the display device 30 such that the α axis is superimposed on the β axis juxtaposed to the Kikuchi map, as illustrated in FIG. 36 (step D12). Then, the operator designates the incident direction of the electron beam such that the incident direction of the electron beam is inclined from the (020) plane by a predetermined angle while an angle of the incident direction with respect to the (−200) plane is unchanged, and then the crystal orientation figure creating unit 2 creates a designated Kikuchi map of the crystal lying at the position J again, based on the information designated on the crystal orientation figure (step D13).

Next, the tilting parameters calculating unit 3 calculates tilting parameters about the α axis, based on the information designated on the crystal orientation figure (step D14). Subsequently, the tilting angle adjusting unit 6 instructs the sample stage 240 included in the SEM 200 to cause the sample stage driving device 250 to change the tilting direction and the tilting value of the sample, based on a result of the calculation in step D14 (step D15).

Figure 37:
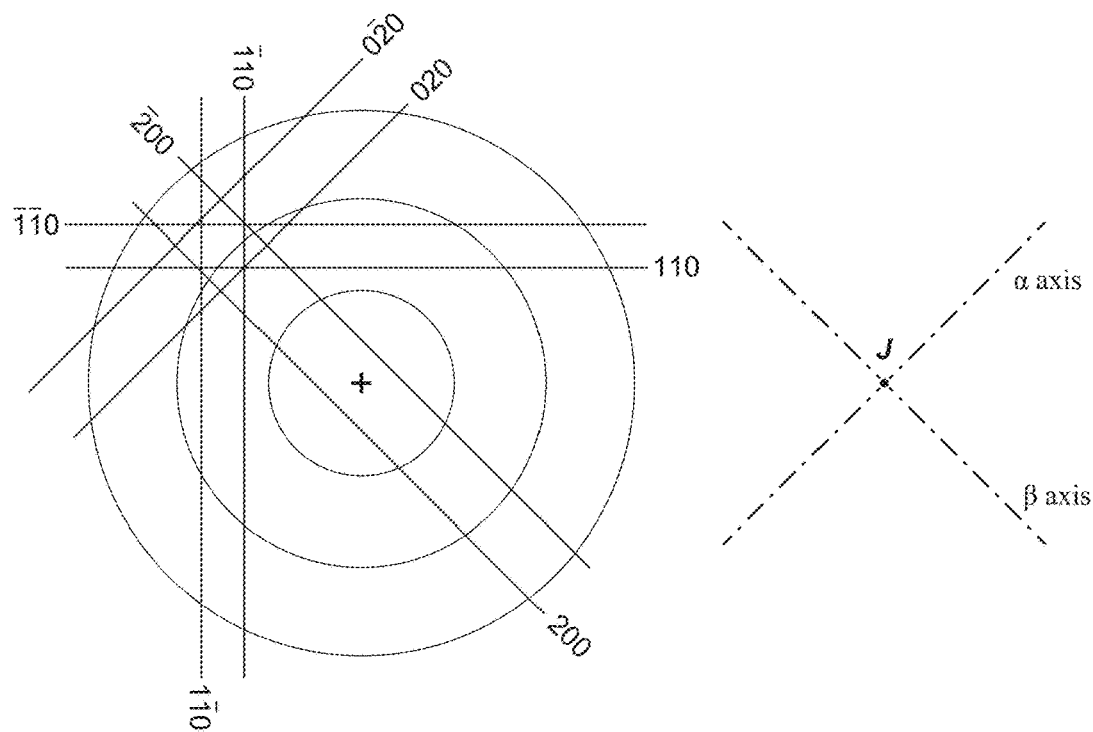
FIG. 37 is a diagram illustrating an example of a designated Kikuchi map schematically.

After the incident direction of the electron beam with respect to the sample is changed, the output unit 5 acquires the designated Kikuchi map and outputs the designated Kikuchi map such that the designated Kikuchi map is displayed on the display device 30 at the same time with the α axis and the β axis as illustrated in FIG. 37 (step D16).

Figure 38:
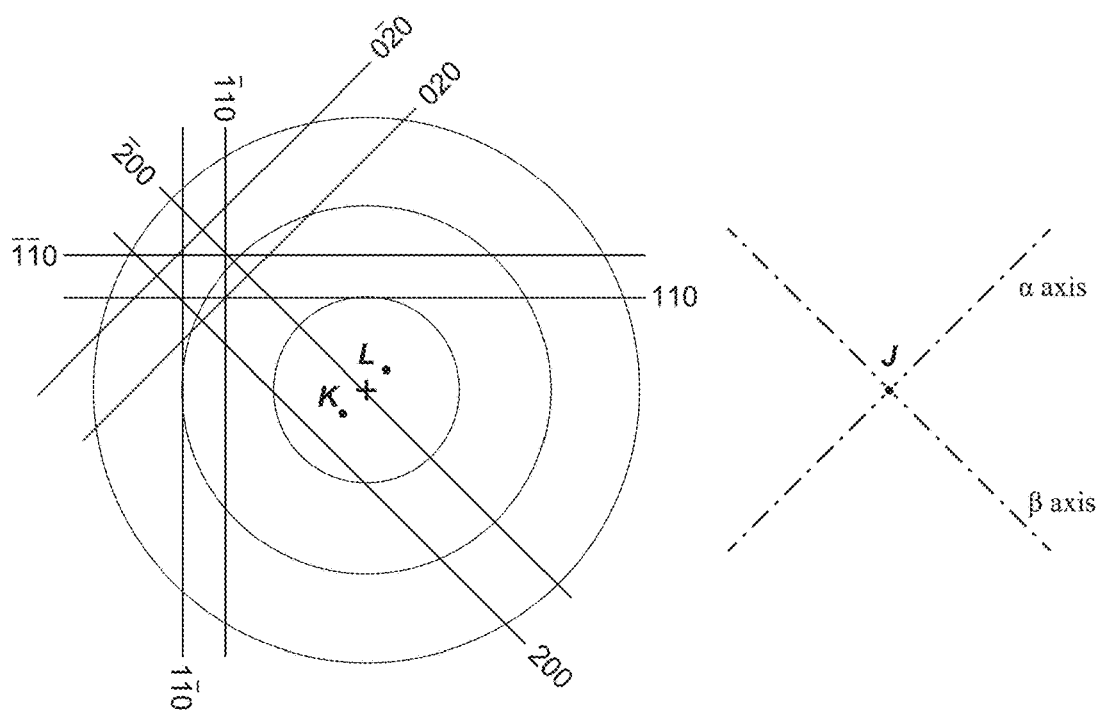
FIG. 38 is a diagram schematically illustrating an example of a Kikuchi map in a middle of being inclined about a β axis after being inclined about an α axis and the β axis.

Then, when the incident direction of an electron beam is moved from a point K to a point L illustrated in FIG. 38, a contrast of the backscattered electron intensity greatly varies about an axis parallel to the (−200) plane. To obtain a channeling condition that makes a contrast between a background and a lattice defect highest within the variation, it is preferable to measure the backscattered electron intensity with the incident direction of the electron beam with respect to the sample being moved from the point K to the point L in FIG. 38 around the β axis, and select a position where the backscattered electron intensity reaches its minimum.

The embodiments described above are described with the cases of using an SEM as an example but are not limited to these cases and hold true for a case of using a TEM.

Fifth Embodiment

Figure 39:
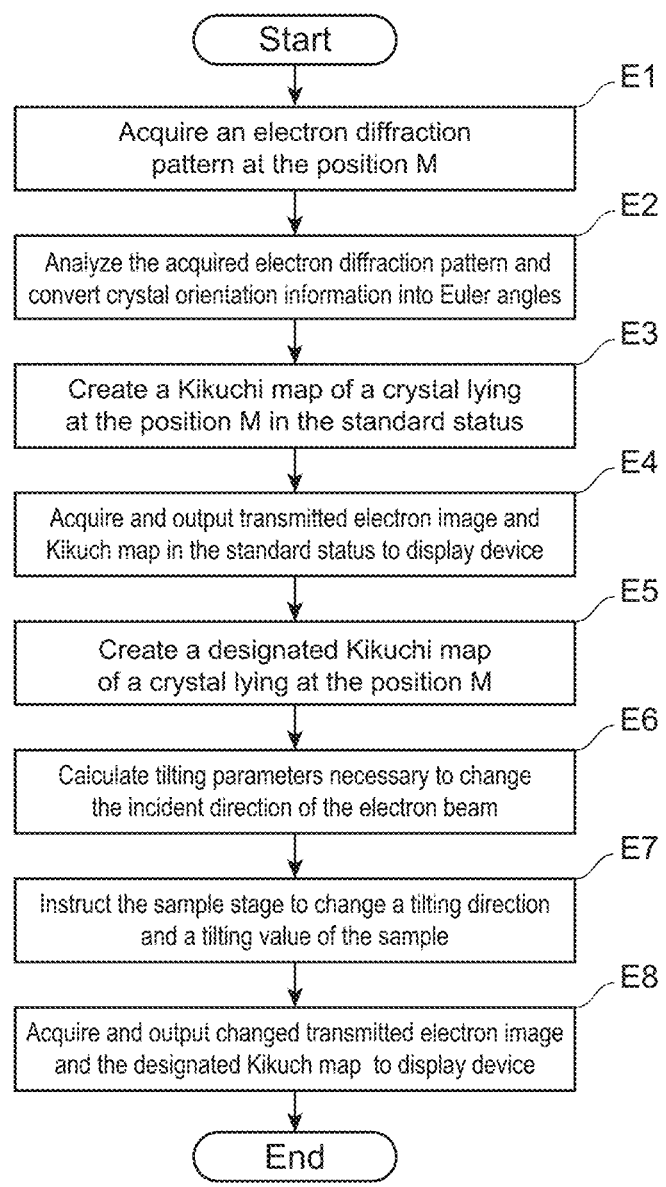
FIG. 39 is a flow chart illustrating operation of a tilting parameters calculating device according to a fifth embodiment of the present invention.

Operation of a tilting parameters calculating device according to a fifth embodiment of the present invention will be described more specifically with reference to FIG. 39. FIG. 39 is a flow chart illustrating the operation of the tilting parameters calculating device according to the fifth embodiment of the present invention.

A TEM provides not only information on an outermost surface of a sample but also information on an interior because the TEM takes an electron diffraction pattern and an image that are formed from an electron beam transmitted through a sample; however, an observation area of a TEM sample is typically a thin film having a thickness of several μm or less; therefore, use of the above-described term "sample surface" will continue.

As a precondition, TEM analysis is conducted at a position selected on a sample surface of a TEM sample by an operator (hereafter, referred to as a "position M"), in the standard status. Subsequently, as illustrated in FIG. 39, the orientation information acquiring unit 1 acquires an electron diffraction pattern at the position M detected by the detector 364 (step E1). In a TEM, a tilting angle of a sample is common to measurement of a transmitted electron image and measurement of an electron diffraction pattern; therefore, an incident direction of a charged particle beam with respect to the sample in acquisition of the electron diffraction pattern forms the standard status. The crystal orientation figure creating unit 2 then analyzes the acquired electron diffraction pattern and converts crystal orientation information on the sample surface into Euler angles (step E2).

Figure 40:
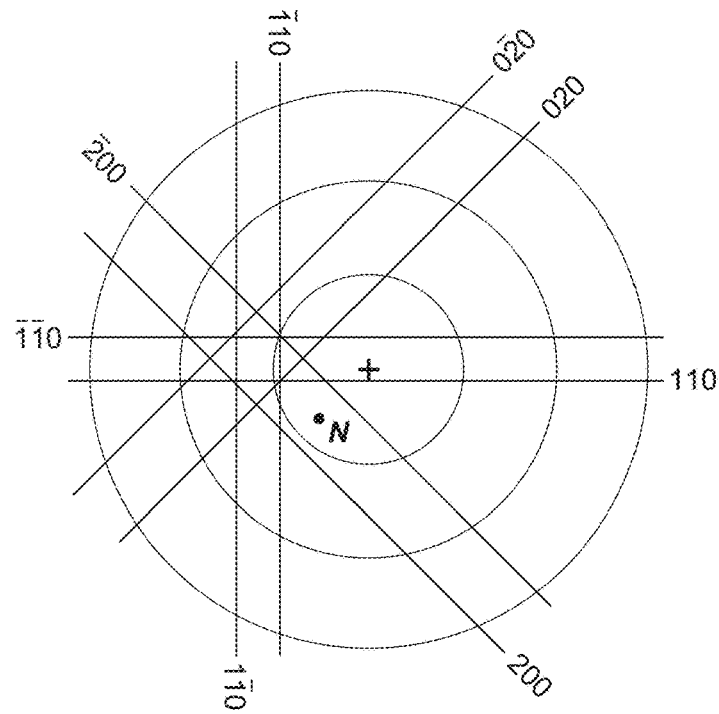
FIG. 40 is a diagram illustrating an example of a Kikuchi map in a standard status schematically.

Subsequently, the crystal orientation figure creating unit 2 creates a Kikuchi map of a crystal lying at the position M in the standard status as illustrated in FIG. 40, based on the orientation information converted into the Euler angles (step E3). Subsequently, the output unit 5 acquires a transmitted electron image in the standard status measured by the TEM 300 and the Kikuchi map (crystal orientation figure) in the standard status, and outputs the image and map such that the image and map are displayed at the same time on the display device 30 (step E4).

Figure 41:
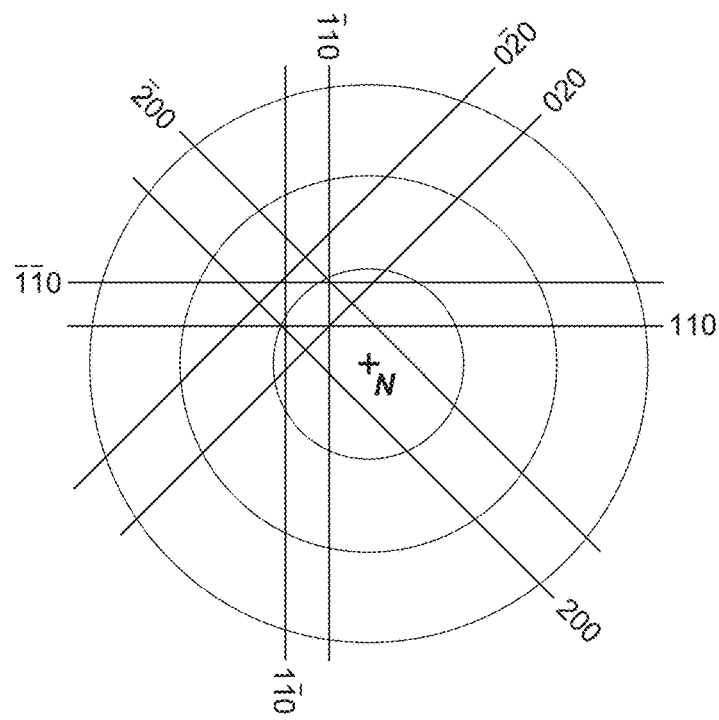
FIG. 41 is a diagram illustrating an example of a designated Kikuchi map schematically.

Thereafter, observing the Kikuchi map displayed on the display device 30, an operator designates a point N on the Kikuchi map such that the point N illustrated in FIG. 40 lies at a center of the Kikuchi map, and then the crystal orientation figure creating unit 2 creates a designated Kikuchi map of a crystal lying at the position M as illustrated in FIG. 41, based on information designated on the crystal orientation figure (step E5). The designation of the point lying at the center can be performed by input instructions from an input device 40 connected to the tilting parameters calculating device 10.

Next, the tilting parameters calculating unit 3 calculates tilting parameters necessary to change the incident direction of the electron beam with respect to the sample, based on the designated information (step E6). Subsequently, the tilting angle adjusting unit 6 instructs the sample stage 340 included in the TEM 300 to cause the sample stage driving device 350 to change the tilting direction and the tilting value of the sample, based on the tilting parameters calculated in step E6 (step E7).

After the incident direction of the electron beam with respect to the sample is changed, the output unit 5 acquires a designated Kikuchi map, as well as a transmitted electron image corresponding to the changed incident direction, the transmitted electron image measured by the TEM 300, and outputs the map and image such that the map and image are displayed at the same time on the display device 30 (step E8).

A virtual Kikuchi map and the transmitted electron image in a state where the virtual Kikuchi map is created are thereby displayed at the same time on the display device 30. The acquisition of the transmitted electron image and the output of the transmitted electron image to the display device 30 may be performed every time the incident direction of the electron beam with respect to the sample is changed, according to an instruction given from an operator, every predetermined interval, or continuously all the time.

[Charged Particle Beam Device According to Other Embodiments]

Figure 42:
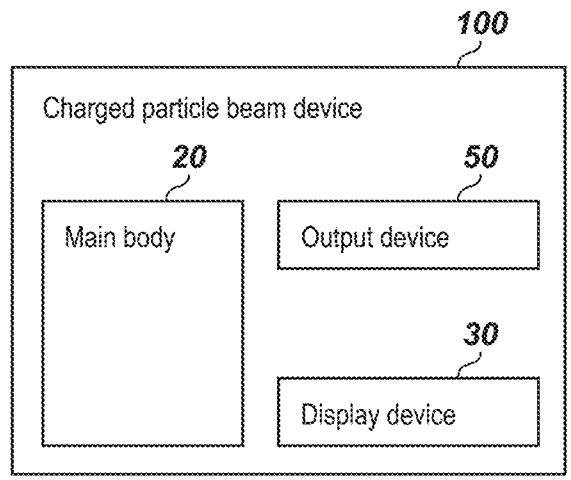
FIG. 42 is a diagram illustrating a schematic configuration of a charged particle beam device according to another embodiment of the present invention.

FIG. 42 is a diagram illustrating a schematic configuration of a charged particle beam device according to another embodiment of the present invention. A charged particle beam device 100 according to another embodiment of the present invention includes a main body 20, an output device 50, and a display device 30.

The output device 50 is configured to acquire a crystal orientation map, a crystal orientation figure, and a charged particle beam image and output the map, figure, and image such that the map, figure, and image are displayed at the same time on the display device 30.

As will be described later, the crystal orientation map and the crystal orientation figure are created by calculation based on crystal orientation information that is measured in advance. The crystal orientation map and the crystal orientation figure may be created by an external device and acquired by the output device 50. Alternatively, the output device 50 may acquire the crystal orientation map and the crystal orientation figure by creating them based on the crystal orientation information.

The crystal orientation information is measured in advance by the main body 20 within a predetermined region. The crystal orientation information includes numeric data containing crystal orientation information such as data that is a rotation matrix of Euler angles or the like with respect to a virtual orthogonal coordinate system on the sample surface into which crystal orientations are converted. Then, based on the numeric data containing the crystal orientation information within the predetermined region, the crystal orientation map is created.

Figure 43:
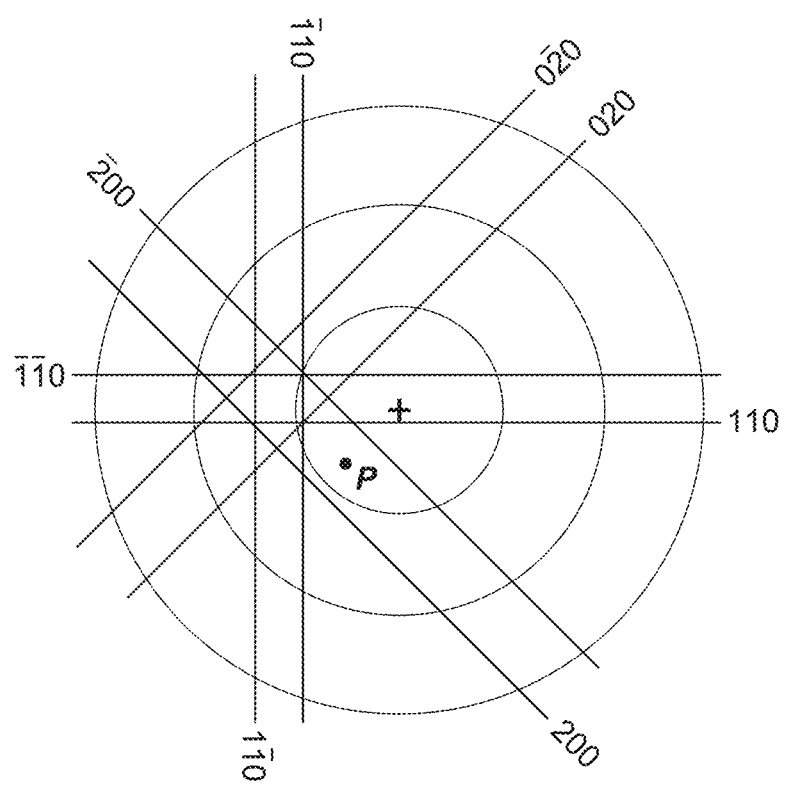
FIG. 43 is a diagram illustrating an example of a Kikuchi map in a standard status schematically.

In addition, a crystal orientation figure as illustrated in FIG. 43 is created based on orientation information at a position selected within the predetermined region (hereinafter, also referred to as a "position O") in a state where the incident direction of the charged particle beam with respect to the sample is in a predetermined incident direction (hereinafter, also referred to as a "standard status").

Then, in a region including the position O, the main body 20 measures the charged particle beam image in the standard status. As described above, the charged particle beam image cannot be measured together with an EBSD pattern, an electron channeling pattern, or an electron diffraction pattern. However, the crystal orientation figure is created by calculation rather than actual measurement, and a charged particle beam image corresponding to the incident direction of the charged particle beam corresponding to the crystal orientation figure is measured. As a result, the output device 20 is able to acquire the crystal orientation map created beforehand, as well as the charged particle beam image and the crystal orientation figure and output the map, image, and figure such that the map, image, and figure are displayed at the same time as illustrated in FIGS. 19, 21, 25, and 30.

The display device 30 is, for example, a liquid crystal display monitor or the like. A number of display devices 30 may be one or more. For example, a crystal orientation map, a charged particle beam image, and a crystal orientation figure may be displayed on one display device 30 or may be displayed on different display devices 30, respectively.

Figure 44:
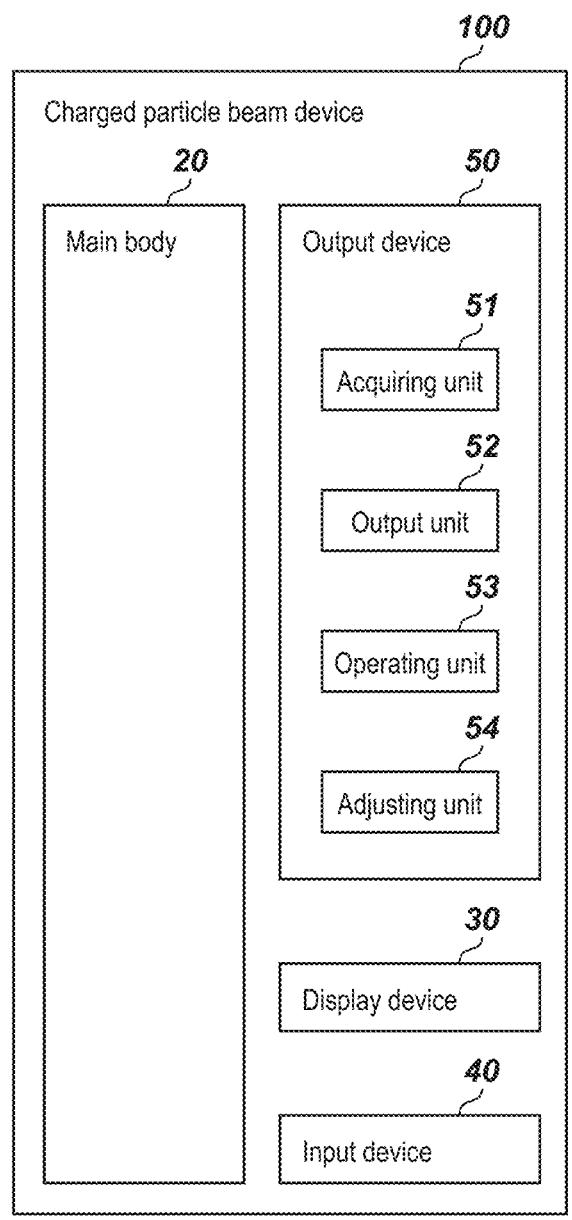
FIG. 44 is a diagram illustrating a schematic configuration of a charged particle beam device according to another embodiment of the present invention.

FIG. 44 is a diagram illustrating a schematic configuration of a charged particle beam device according to another embodiment of the present invention. In the configuration illustrated in FIG. 44, a charged particle beam device 100 further includes an input device 40. The output device 50 includes an acquiring unit 51, an output unit 52, an operating unit 53, and an adjusting unit 54.

In the present embodiment, the acquiring unit 51 is configured to acquire a crystal orientation map, a crystal orientation figure, and a charged particle beam image, and the output unit 52 is configured to output the map, figure, and image such that the map, figure, and image are displayed at the same time on the display device 30. The output unit 52 is further configured to output a crystal orientation figure as illustrated in FIG. 43 to the display device 30, as an image for operation. In response to an operation on the display device 30 performed by an operator using the input device 40, the operating unit 53 performs a process for changing an incident direction of a charged particle beam with respect to a sample, on the image for operation.

The process for changing the incident direction of the charged particle beam with respect to the sample is not particularly limited, but examples of the process include a process for virtually creating a crystal orientation figure in a case where the incident direction is changed.

Figure 45:
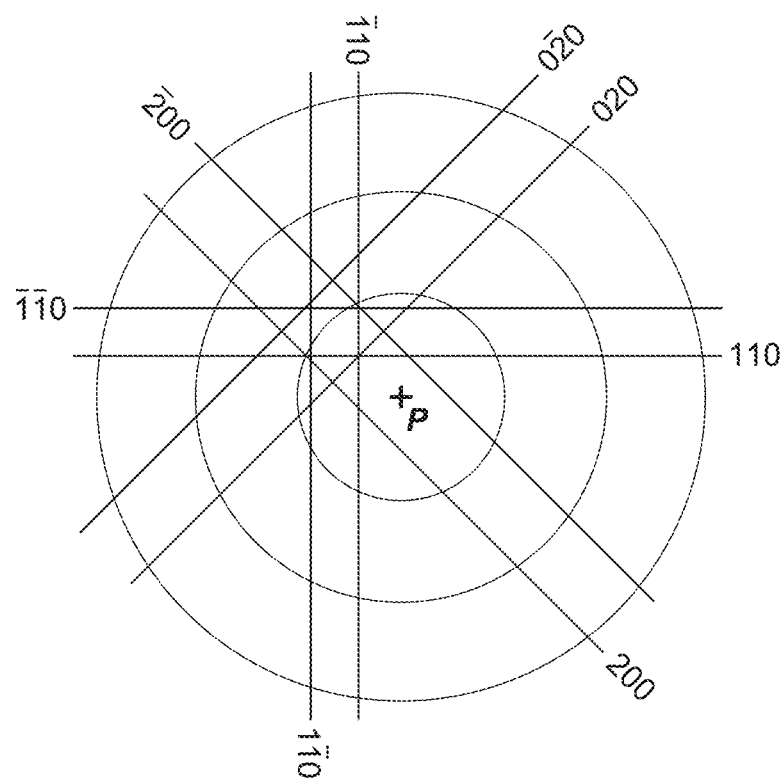
FIG. 45 is a diagram illustrating an example of a designated Kikuchi map schematically.

The operation performed by the operator is not particularly limited, either, and for example, the operator can perform an input as appropriate from the input device 40 such that a point P illustrated in FIG. 43 lies at a center of the crystal orientation figure. In response to the input, the operating unit 53 calculates an incident direction of the charged particle beam with respect to the sample that makes the point P point lie at the center and virtually generates a crystal orientation figure with such an incident direction, as illustrated in FIG. 45.

The adjusting unit 54 then actually changes the incident direction of the charged particle beam with respect to the sample based on the process performed by the operating unit 53. That is, the adjusting unit 54 performs an adjustment such that the incident direction to make the point P lie at the center calculated by the operating unit 53 coincides with the actual incident direction. Specifically, the adjusting unit 54 changes the incident direction of the charged particle beam with respect to the sample by changing a tilting direction and a tilting value (tilting angle depended on an axis line) of the sample and/or the charged particle beam.

As seen from the above, including the operating unit 53 and the adjusting unit 54 allows an operator to perform an operation looking at a crystal orientation figure being an image for operation to virtually change the incident direction of the charged particle beam with respect to the sample and create a crystal orientation figure again, following which it is possible to change an actual incident direction. The main body 20 then measures a charged particle beam image again in a state where the incident direction is changed.

Thereafter, the acquiring unit 51 acquires the crystal orientation map, as well as the crystal orientation figure and the charged particle beam image in a state of the changed incident direction, and the output unit 52 outputs the map, figure, and image such that the map, figure, and image are displayed at the same time on the display device 30. As a result, it is possible to display the crystal orientation map, the crystal orientation figure and the charged particle beam image at the same time even while changing the incident direction of the charged particle beam with respect to the sample.

A program according to an embodiment of the present invention may be any program as long as it causes a computer to execute steps A1 to A8 illustrated in FIG. 11, steps B1 to B10 illustrated in FIG. 16, steps C1 to C18 illustrated in FIG. 22, steps D1 to D16 illustrated in FIG. 32, or steps E1 to E8 illustrated in FIG. 39. The tilting parameters calculating device 10 according to the present embodiment can be realized by installing the program in a computer and executing the program. In this case, a processor of the computer functions as the orientation information acquiring unit 1, the crystal orientation figure creating unit 2, the tilting parameters calculating unit 3, the rotation axis setting unit 4, the output unit 5, and the tilting angle adjusting unit 6 to perform processing.

The program of the present embodiment may be executed by a computer system constructed from a plurality of computers. In this case, for example, each of the computers may function as any one of the orientation information acquiring unit 1, the crystal orientation figure creating unit 2, the tilting parameters calculating unit 3, the rotation axis setting unit 4, the output unit 5, and the tilting angle adjusting unit 6.

Figure 46:
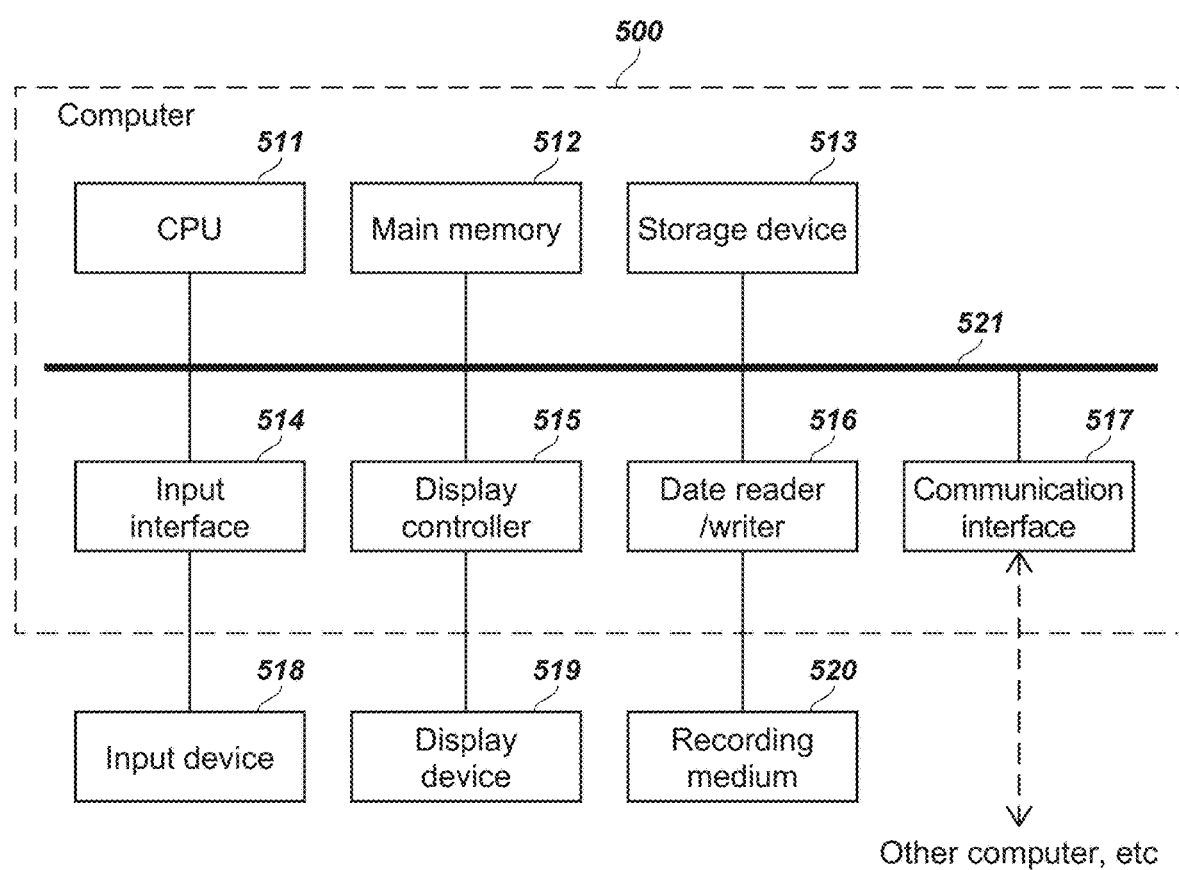
FIG. 46 is a block diagram illustrating an example of a computer that implements a tilting parameters calculating device according to embodiments of the present invention.

A computer that realizes the tilting parameters calculating device 10 by executing programs according to the first to fifth embodiments will be described with reference to FIG. 46. FIG. 46 is a block diagram illustrating an example of a computer realizing the tilting parameters calculating device 10 according to the first to fifth embodiments of the present invention.

As illustrated in FIG. 46, a computer 500 includes a CPU (central processing unit) 511, a main memory 512, a storage device 513, an input interface 514, a display controller 515, a data reader/writer 516, and a communication interface 517. These components are connected to each other over a bus 521 such that they are able to perform data communication with each other. The computer 500 may include a GPU (graphics processing unit) or an FPGA (Field-Programmable Gate Array) in addition to or in place of the CPU 511.

The CPU 511 loads the programs (codes) according to the present embodiment, which is stored in the storage device 513, into the main memory 512, and executes the programs according to a prescribed sequence, thereby carrying out various types of operations. The main memory 512 is typically a volatile storage device such as DRAM (Dynamic Random Access Memory) or the like. In addition, the programs according to the present embodiment is stored in a computer-readable recording medium 520 and provided in such a state. Note that the program according to the present embodiment may be distributed over the Internet, which is connected via the communication interface 517.

In addition to a hard disk drive, a semiconductor storage device such as flash memory or the like can be given as a specific example of the storage device 513. The input interface 514 facilitates data transfer between the CPU 511 and an input device 518 such as a keyboard and a mouse. The display controller 515 can be connected to a display device 519, and controls displays made in the display device 519.

The data reader/writer 516 facilitates data transfer between the CPU 511 and the recording medium 520, reads out programs from the recording medium 520, and writes results of processing performed by the computer 510 into the recording medium 520. The communication interface 517 facilitates data exchange between the CPU 511 and other computers.

A generic semiconductor storage device such as CF (Compact Flash (registered trademark)), SD (Secure Digital), or the like, a magnetic storage medium such as a flexible disk or the like, an optical storage medium such as a CD-ROM (Compact Disk Read Only Memory) or the like, and so on can be given as specific examples of the recording medium 520.

The tilting parameters calculating device 10 according to the present embodiment can also be realized using hardware corresponding to the respective units, instead of a computer in which a program is installed. Alternatively, the tilting parameters calculating device 10 may be partially realized by a program, with the remaining parts realized by hardware. Furthermore, the tilting parameters calculating device 10 may be formed by using a cloud server.

A part or a whole of the embodiments described above can be expressed by (Note 1) to (Note 40) described below but are not limited to the following description.
(Note 1)
A tilting parameters calculating device for use in a charged particle beam device for making a charged particle beam irradiated to a surface of a sample mounted on a sample stage, the tilting parameters calculating device being configured to calculate tilting parameters, the tilting parameters being input parameters to control a tilting direction and a tilting value (tilting angle depended on an axis line) of the sample and/or the charged particle beam, the input parameters being necessary to change an incident direction of the charged particle beam with respect to the sample, the tilting parameters calculating device including
a tilting parameters calculating unit for calculating the tilting parameters based on information that indicates the incident direction of the charged particle beam with respect to a crystal lying at a selected position on the surface in a state where the incident direction of the charged particle beam with respect to the sample is in a predetermined incident direction, the information being designated on a crystal orientation figure, which is a diagram illustrating the incident direction of the charged particle beam with respect to a crystal coordinate system of the crystal.
(Note 2)
The tilting parameters calculating device according to Note 1, further including:
an orientation information acquiring unit configured to acquire crystal orientation information on the surface; and
a crystal orientation figure creating unit configured to create the crystal orientation figure of the crystal lying at the selected position based on the orientation information.
(Note 3)
The tilting parameters calculating device according to Note 2, wherein the crystal orientation figure creating unit is configured to create a designated crystal orientation figure of the crystal lying at the selected position based on the information designated on the crystal orientation figure.
(Note 4)
The tilting parameters calculating device according to Note 2 or Note 3, wherein
the crystal orientation figure creating unit is configured to, based on the orientation information, create a crystal orientation figure of a crystal lying at another position different from the selected position in a state where the incident direction of the charged particle beam with respect to the surface is in a predetermined incident direction, and
the tilting parameters calculating unit is configured to calculate the tilting parameters based on information that indicates the incident direction of the charged particle beam with respect to the crystal lying at the selected position and an incident direction of the charged particle beam with respect to the crystal lying at the other position, wherein the information is designated on the crystal orientation figure of the crystal lying at the selected position and on the crystal orientation figure of the crystal lying at the other position, respectively.
(Note 5)
The tilting parameters calculating device according to any one of Note 2 to Note 4, further including
a rotation axis setting unit configured to set an axis passing the selected position as a rotation axis, based on the crystal orientation figure, wherein
so that the incident direction and one crystal plane included on the crystal lying at the selected position form a predetermined angle, based on the information designated to the crystal orientation figure,
the rotation axis setting unit is configured to set the axis such that the axis is parallel or perpendicular to one crystal plane and
the tilting parameters calculating unit is configured to calculate tilting parameters that are necessary to change a tilting direction and a tilting value (tilting angle depended on an axis line) of the sample and/or the charged particle beam around the rotation axis so that the one crystal plane and the incident direction form the predetermined angle.

(Note 6)

The tilting parameters calculating device according to Note 5, wherein the rotation axis setting unit is configured to set two axes that intersect each other at the selected position as rotation axes, and set the two axes such that:

one of the two axes is parallel or perpendicular to the one crystal plane; and the other of the two axes is parallel to the one crystal plane.

(Note 7)

The tilting parameters calculating device according to Note 5, wherein the rotation axis setting unit is configured to set two axes that intersect each other at the selected position as rotation axes, and set the two axes such that:

one of the two axes is parallel or perpendicular to the one crystal plane; and the other of the two axes is parallel or perpendicular to another crystal plane included in the crystal lying at the selected position.

(Note 8)

The tilting parameters calculating device according to any one of Note 2 to Note 7, further including an output unit, wherein the output unit is configured to acquire a charged particle beam image of the surface corresponding to the predetermined incident direction, the charged particle beam image being measured by the charged particle beam device, and the crystal orientation figure and/or the designated crystal orientation figure of the crystal lying at the selected position created by the crystal orientation figure creating unit, and output the charged particle beam image, and the crystal orientation figure and/or the designated crystal orientation figure of the crystal lying at the selected position to an external display device such that the charged particle beam image, and the crystal orientation figure and/or the designated crystal orientation figure are displayed at the same time on the display device.

(Note 9)

The tilting parameters calculating device according to Note 8, wherein the output unit is configured to further acquire the crystal orientation figure and/or the designated crystal orientation figure of the crystal lying at the other position created by the crystal orientation figure creating unit, and output the charged particle beam image, the crystal orientation figure and/or the designated crystal orientation figure of the crystal lying at the selected position, and the crystal orientation figure and/or the designated crystal orientation figure of the crystal lying at the other position, to an external display device such that the charged particle beam image, the crystal orientation figure and/or the designated crystal orientation figure of the crystal lying at the selected position, and the crystal orientation figure and/or the designated crystal orientation figure of the crystal lying at the other position are displayed at the same time on the display device.

(Note 10)

The tilting parameters calculating device according to any one of Note 2 to Note 9, further including a tilting angle adjusting unit, wherein the tilting angle adjusting unit is configured to, based on the tilting parameters calculated by the tilting parameters calculating unit, perform at least one of instructing the sample stage to change the tilting direction and the tilting value of the sample and instructing the charged particle beam device to change the tilting direction and the tilting value of the charged particle beam.

(Note 11)

The tilting parameters calculating device according to Note 8 or Note 9, further including a tilting angle adjusting unit, wherein the tilting angle adjusting unit is configured to, based on the tilting parameters calculated by the tilting parameters calculating unit, perform at least one of instructing the sample stage to change the tilting direction and the tilting value of the sample and instructing the charged particle beam device to change the tilting direction and the tilting value of the charged particle beam, and when the incident direction of the charged particle beam with respect to the sample is changed in response to the instruction from the tilting angle adjusting unit, the output unit further acquires a charged particle beam image of the surface corresponding to the changed incident direction, the charged particle beam image being measured by the charged particle beam device, and outputs the charged particle beam image, and the crystal orientation figure and/or the designated crystal orientation figure of the crystal lying at the selected position corresponding to the predetermined incident direction and/or the changed incident direction on the surface, or the charged particle beam image, the crystal orientation figure and/or the designated crystal orientation figure of the crystal lying at the selected position, and the crystal orientation figure and/or the designated crystal orientation figure of the crystal lying at the other position corresponding to the predetermined incident direction and/or the changed incident direction on the surface, to an external display device such that the image and figure are displayed at the same time on the display device.

(Note 12)

A sample stage including the tilting parameters calculating device according to Note 10 or Note 11, wherein the tilting direction and the tilting value of the sample can be changed in response to the instruction from the tilting angle adjusting unit.

(Note 13)

A charged particle beam device, including the tilting parameters calculating device according to Note 10 or Note 11, and the tilting direction and the tilting value of the charged particle beam can be changed in response to the instruction from the tilting angle adjusting unit.

(Note 14)

A charged particle beam device including the sample stage according to Note 12.

(Note 15)

A charged particle beam device including a main body, an output device, and a display device, wherein the main body is capable of measuring crystal orientation information and a charged particle beam image in a predetermined region on a surface of a sample by irradiate a charged particle beam onto the surface, the output device is configured to acquire:

a crystal orientation map created by the main body based on orientation information that is measured in advance in the predetermined region;

a crystal orientation figure in a state where an incident direction of the charged particle beam with respect to the surface is in a predetermined incident direction, the crystal orientation figure being created based on orientation information on a selected position in the predetermined region; and a charged particle beam image in a region including the selected position in the state where the incident direction of the charged particle beam is the predetermined incident direction, the charged particle beam image being measured by the main body, and output the crystal orientation map, the crystal orientation figure, and the charged particle beam image such that the map, figure, and image are displayed at the same time on the display device.

(Note 16)

The charged particle beam device according to Note 15, wherein the output device includes an acquiring unit, an output unit, and an operating unit, the acquiring unit is configured to acquire the crystal orientation map, the crystal orientation figure, and the charged particle beam image, the output unit is configured to output the crystal direction map, the crystal orientation figure, and the charged particle beam image to the display device such that the map, figure, and image are displayed at the same time on the display device, and to output the crystal orientation figure to the display device as an image for operation, and the operating unit is configured to, in response to an operation of an operator, performs a process for changing the incident direction of the charged particle beam with respect to the sample for the image for operation.

(Note 17)

The charged particle beam device according to Note 16, wherein the output device further includes an adjusting unit, and the adjusting unit is configured to changes the incident direction of the charged particle beam with respect to the sample, based on the process performed by the operating unit.

(Note 18)

The charged particle beam device according to Note 17, wherein the acquiring unit is configured to acquire:

the crystal orientation map;

a crystal orientation figure in a state where the incident direction of the charged particle beam with respect to the sample is the incident direction changed by the adjusting unit, the crystal orientation figure created based on the orientation information on the selected position in the predetermined region; and a charged particle beam image in a region including the selected position in the state where the incident direction of the charged particle beam is the changed incident direction, the charged particle beam image being measured by the main body, and the output unit is configured to output the crystal orientation map, and the crystal orientation figure and the charged particle beam image in the state where the incident direction of each of the crystal orientation figure and the charged particle beam is the changed incident direction at the same time to the display device.

(Note 19)

A tilting parameters calculating method for use in a charged particle beam device for making a charged particle beam irradiated to a surface of a sample mounted on a sample stage, the method being for calculating tilting parameters, the tilting parameters being input parameters to control a tilting direction and a tilting value (tilting angle depended on an axis line) of the sample and/or the charged particle beam, the input parameters being necessary to change an incident direction of the charged particle beam with respect to the sample, the method including calculating the tilting parameters based on information that indicates an incident direction of a charged particle beam with respect to a crystal lying at a selected position on the surface in a state where the incident direction of the charged particle beam with respect to the sample is in a predetermined incident direction, the information being designated on a crystal orientation figure, which is a diagram illustrating the incident direction of the charged particle beam with respect to a crystal coordinate system of the crystal.

(Note 20)

The tilting parameters calculating method according to Note 19, including:

(a) a step of acquiring crystal orientation information on the surface;

(b) a step of creating the crystal orientation figure of the crystal lying at the selected position, based on the orientation information; and (c) a step of calculating the tilting parameters.

(Note 21)

The tilting parameters calculating method according to Note 20, wherein in the step (b), a designated crystal orientation figure of the crystal lying at the selected position is created based on the information designated on the crystal orientation figure.

(Note 22)

The tilting parameters calculating method according to Note 20 or Note 21, wherein in the step (b), a crystal orientation figure of a crystal lying at another position different from the selected position in a state where the incident direction of the charged particle beam with respect to the surface is in a predetermined incident direction is created based on the orientation information, and in the step (c), the tilting parameters is calculated based on information that indicates the incident direction of the charged particle beam with respect to the crystal lying at the selected position and an incident direction of the charged particle beam with respect to the crystal lying at the other position, wherein the information is designated on the crystal orientation figure of the crystal lying at the selected position and on the crystal orientation figure of the crystal lying at the other position, respectively.

(Note 23)

The tilting parameters calculating method according to any one of Note 20 to Note 22, further including (d) a step of setting an axis passing the selected position as a rotation axis based on the crystal orientation figure, wherein so that the incident direction and one crystal plane included on the crystal lying at the selected position form a predetermined angle, based on the information designated on the crystal orientation figure, in the step (d), the axis is set such that the axis is parallel or perpendicular to the one crystal plane, and in the step (c), tilting parameters that are necessary to change a tilting direction and a tilting value (tilting angle depended on an axis line) of the sample and/or the charged particle beam about the rotation axis so that the one crystal plane and the incident direction form the predetermined angle are calculated.

(Note 24)

The tilting parameters calculating method according to Note 23, wherein in the step (d), two axes that intersect each other at the selected position are set as rotation axes and set such that:

one of the two axes is parallel or perpendicular to the one crystal plane; and the other of the two axes is parallel to the one crystal plane.

(Note 25)

The tilting parameters calculating method according to Note 23, wherein in the step (d), two axes that intersect each other at the selected position are set as rotation axes and set such that:

one of the two axes is parallel or perpendicular to the one crystal plane; and the other of the two axes is parallel or perpendicular to another crystal plane included in the crystal lying at the selected position.

(Note 26)

The tilting parameters calculating method according to any one of Note 20 to Note 25, further including (e) a step of acquiring a charged particle beam image of the surface corresponding to the predetermined incident direction, the charged particle beam image being measured by the charged particle beam device, and the crystal orientation figure and/or the designated crystal orientation figure of the crystal lying at the selected position created in the step (b), and outputting the charged particle beam image, and the crystal orientation figure and/or the designated crystal orientation figure of the crystal lying at the selected position to an external display device such that the image and figure are displayed at the same time on the display device.

(Note 27)

The tilting parameters calculating method according to Note 26, wherein in the step (e), the crystal orientation figure and/or the designated crystal orientation figure of the crystal lying at the other position created in the step (b) are further acquired, and the charged particle beam image, the crystal orientation figure and/or the designated crystal orientation figure of the crystal lying at the selected position, and the crystal orientation figure and/or the designated crystal orientation figure of the crystal lying at the other position are output to an external display device such that the image and figures are displayed at the same time on the display device.

(Note 28)

The tilting parameters calculating method according to any one of Note 20 to Note 27, further including (f) a step of performing, based on the tilting parameters calculated at the step (c), at least one of instructing the sample stage to change the tilting direction and the tilting value of the sample and instructing the charged particle beam device to change the tilting direction and the tilting value of the charged particle beam.

(Note 29)

The tilting parameters calculating method according to Note 26 or Note 27, further including (f) a step of performing, based on the tilting parameters calculated at the step (c), at least one of instructing the sample stage to change the tilting direction and the tilting value of the sample and instructing the charged particle beam device to change the tilting direction and the tilting value of the charged particle beam, wherein when the incident direction of the charged particle beam with respect to the sample is changed in response to the instruction made in the step (f), in the step (e), a charged particle beam image on the surface corresponding to the changed incident direction is further acquired, the charged particle beam image being measured by the charged particle beam device, and the charged particle beam image, and the crystal orientation figure and/or the designated crystal orientation figure of the crystal lying at the selected position corresponding to the predetermined incident direction and/or the changed incident direction on the surface, or the charged particle beam image, the crystal orientation figure and/or the designated crystal orientation figure of the crystal lying at the selected position, and the crystal orientation figure and/or the designated crystal orientation figure of the crystal lying at the other position, corresponding to the predetermined incident direction and/or the changed incident direction on the surface, are output to an external display device such that the image and figures are displayed at the same time on the display device.

(Note 30)

A program for use in a charged particle beam device for making a charged particle beam irradiated to a surface of a sample mounted on a sample stage, the program being run on a computer to calculate tilting parameters, the tilting parameters being input parameters to control a tilting direction and a tilting value (tilting angle depended on an axis line) of the sample and/or the charged particle beam, the input parameters being necessary to change an incident direction of the charged particle beam with respect to the sample, the program causing the computer to execute a step of, with an incident direction of the charged particle beam with respect to the sample being a predetermined incident direction, calculating the tilting parameters based on information that indicates an incident direction of the charged particle beam with respect to a crystal lying at a selected position on the surface, the information being designated on a crystal orientation figure, which is a diagram illustrating the incident direction of the charged particle beam with respect to a crystal coordinate system of the crystal.

(Note 31)

The program according to Note 30 causing the computer to execute:

(a) a step of acquiring crystal orientation information on the surface;

(b) a step of creating the crystal orientation figure of the crystal lying at the selected position, based on the orientation information; and (c) a step of calculating the tilting parameters.

(Note 32)

The program according to Note 31, wherein in the step (b), a designated crystal orientation figure of the crystal lying at the selected position is created based on the information designated on the crystal orientation figure.

(Note 33)

The program according to Note 31 or Note 32, wherein in the step (b), a crystal orientation figure of a crystal lying at another position different from the selected position in a state where the incident direction of the charged particle beam with respect to the surface is in a predetermined incident direction is created based on the orientation information, and in the step (c), the tilting parameters is calculated based on information that indicates the incident direction of the charged particle beam with respect to the crystal lying at the selected position and an incident direction of the charged particle beam with respect to the crystal lying at the other position, wherein the information is designated on the crystal orientation figure of the crystal lying at the selected position and on the crystal orientation figure of the crystal lying at the other position, respectively.

(Note 34)

The program according to any one of Note 31 to Note 33, further including (d) a step of setting an axis passing the selected position as a rotation axis based on the crystal orientation figure, wherein so that the incident direction and one crystal plane included on the crystal lying at the selected position form a predetermined angle, based on the information designated on the crystal orientation figure, in the step (d), the axis is set such that the axis is parallel or perpendicular to the one crystal plane, and in the step (c), tilting parameters that are necessary to change a tilting direction and a tilting value (tilting angle depended on an axis line) of the sample and/or the charged particle beam about the rotation axis so that the one crystal plane and the incident direction form the predetermined angle are calculated.

(Note 35)

The program according to Note 34, wherein in the step (d), two axes that intersect each other at the selected position are set as rotation axes, and the two axes are set such that:

one of the two axes is parallel or perpendicular to the one crystal plane; and the other of the two axes is parallel to the one crystal plane.

(Note 36)

The program according to Note 34, wherein in the step (d), two axes that intersect each other at the selected position are set as rotation axes, and the two axes are set such that:

one of the two axes is parallel or perpendicular to the one crystal plane; and the other of the two axes is parallel or perpendicular to another crystal plane included in the crystal lying at the selected position.

(Note 37)

The program according to any one of Note 31 to Note 36, further including (e) a step of acquiring a charged particle beam image of the surface corresponding to the predetermined incident direction, the charged particle beam image being measured by the charged particle beam device, and the crystal orientation figure and/or the designated crystal orientation figure of the crystal lying at the selected position created in the step (b), and outputting the charged particle beam image, and the crystal orientation figure and/or the designated crystal orientation figure of the crystal lying at the selected position to an external display device such that the image and figure are displayed at the same time on the display device.

(Note 38)

The program according to Note 37, wherein in the step (e), the crystal orientation figure and/or the designated crystal orientation figure of the crystal lying at the other position created in the step (b) is further acquired, and the charged particle beam image, the crystal orientation figure and/or the designated crystal orientation figure of the crystal lying at the selected position, and the crystal orientation figure and/or the designated crystal orientation figure of the crystal lying at the other position are output to an external display device such that the image and figures are displayed at the same time on the display device.

(Note 39)

The program according to any one of Note 31 to Note 38, further including (f) a step of performing, based on the tilting parameters calculated at the step (c), at least one of instructing the sample stage to change the tilting direction and the tilting value of the sample and instructing the charged particle beam device to change the tilting direction and the tilting value of the charged particle beam.

(Note 40)

The program according to Note 37 or Note 38, further including (f) a step of performing, based on the tilting parameters calculated at the step (c), at least one of instructing the sample stage to change the tilting direction and the tilting value of the sample and instructing the charged particle beam device to change the tilting direction and the tilting value of the charged particle beam, wherein when the incident direction of the charged particle beam with respect to the sample is changed in response to the instruction made in the step (f), in the step (e), a charged particle beam image on the surface corresponding to the changed incident direction is further acquired, the charged particle beam image being measured by the charged particle beam device, and the charged particle beam image, and the crystal orientation figure and/or the designated crystal orientation figure of the crystal lying at the selected position corresponding to the predetermined incident direction and/or the changed incident direction on the surface, or the charged particle beam image, the crystal orientation figure and/or the designated crystal orientation figure of the crystal lying at the selected position, and the crystal orientation figure and/or the designated crystal orientation figure of the crystal lying at the other position corresponding to the predetermined incident direction and/or the changed incident direction on the surface, are output to an external display device such that the image and figures are displayed at the same time on the display device.

INDUSTRIAL APPLICABILITY

According to the present invention, it is possible to calculate tilting parameters for adjusting an incident direction of a charged particle beam so that a desired crystal orientation figure can be created even while measurement is conducted in a charged particle beam device such as an SEM, TEM, and SIM, using any function provided by the charged particle beam device.

REFERENCE SIGNS LIST

1. Orientation information acquiring unit
2. Crystal orientation figure creating unit
3. Tilting parameters calculating unit
4. Rotation axis setting unit
5. Output unit
6. Tilting angle adjusting unit
10. Tilting parameters calculating device
20. Main body 30. Display device
40. Input device
50. Output device
100. Charged particle beam device
200. SEM
300. TEM
500. Computer
M1. IPF map
M2. Kikuchi map
M3. Backscattered electron image
CB. Charged particle beam

The invention claimed is:

1. A tilting parameters calculating device for use in a charged particle beam device for making a charged particle beam irradiated to a surface of a sample mounted on a sample stage, the tilting parameters calculating device being configured to calculate tilting parameters, the tilting parameters being input parameters to control a tilting direction and a tilting value of the sample and/or the charged particle beam, the input parameters being necessary to change an incident direction of the charged particle beam with respect to the sample, the tilting parameters calculating device comprising
a tilting parameters calculating unit for calculating the tilting parameters based on information that indicates the incident direction of the charged particle beam with respect to a crystal lying at a selected position on the surface of the sample in a state where the incident direction of the charged particle beam with respect to the sample is in a predetermined incident direction, the information being designated on a crystal orientation figure, which is a diagram illustrating the incident direction of the charged particle beam with respect to a crystal coordinate system of the crystal.

2. The tilting parameters calculating device according to claim 1, further including:
an orientation information acquiring unit configured to acquire crystal orientation information on the surface of the sample; and
a crystal orientation figure creating unit configured to create the crystal orientation figure of the crystal lying at the selected position based on the orientation information.

3. The tilting parameters calculating device according to claim 2, wherein the crystal orientation figure creating unit is configured to create a designated crystal orientation figure of the crystal lying at the selected position based on the information designated on the crystal orientation figure.

4. The tilting parameters calculating device according to claim 2, wherein
the crystal orientation figure creating unit is configured to, based on the orientation information, create a crystal orientation figure of a crystal lying at another position different from the selected position in a state where the incident direction of the charged particle beam with respect to the surface is in a predetermined incident direction, and
the tilting parameters calculating unit is configured to calculate the tilting parameters based on information that indicates the incident direction of the charged particle beam with respect to the crystal lying at the selected position and an incident direction of the charged particle beam with respect to the crystal lying at the other position, wherein the information is designated on the crystal orientation figure of the crystal lying at the selected position and on the crystal orientation figure of the crystal lying at the other position, respectively.

5. The tilting parameters calculating device according to claim 2, further comprising
a rotation axis setting unit configured to set an axis passing the selected position as a rotation axis, based on the crystal orientation figure, wherein
so that the incident direction and one crystal plane included on the crystal lying at the selected position form a predetermined angle, based on the information designated on the crystal orientation figure,
the rotation axis setting unit is configured to set the axis such that the axis is parallel or perpendicular to the one crystal plane, and
the tilting parameters calculating unit is configured to calculate tilting parameters that are necessary to change a tilting direction and a tilting value of the sample and/or the charged particle beam around the rotation axis so that the one crystal plane and the incident direction form the predetermined angle.

6. The tilting parameters calculating device according to claim 5, wherein
the rotation axis setting unit is configured to set two axes that intersect each other at the selected position as rotation axes, and set the two axes such that:
one of the two axes is parallel or perpendicular to the one crystal plane; and
the other of the two axes is parallel to the one crystal plane.

7. The tilting parameters calculating device according to claim 5, wherein
the rotation axis setting unit is configured to set two axes that intersect each other at the selected position as rotation axes, and set the two axes such that:
one of the two axes is parallel or perpendicular to the one crystal plane; and
the other of the two axes is parallel or perpendicular to another crystal plane included in the crystal lying at the selected position.

8. The tilting parameters calculating device according to claim 2, further comprising
an output unit, wherein
the output unit is configured to acquire a charged particle beam image of the surface corresponding to the predetermined incident direction, the charged particle beam image being measured by the charged particle beam device, and the crystal orientation figure and/or the designated crystal orientation figure of the crystal lying at the selected position created by the crystal orientation figure creating unit, and
output the charged particle beam image, and the crystal orientation figure and/or the designated crystal orientation figure of the crystal lying at the selected position to an external display device such that the charged particle beam image, and the crystal orientation figure and/or the designated crystal orientation figure are displayed at the same time on the display device.

9. The tilting parameters calculating device according to claim 8, wherein
the output unit is configured to further acquire the crystal orientation figure and/or the designated crystal orientation figure of the crystal lying at the other position created by the crystal orientation figure creating unit, and
output the charged particle beam image, the crystal orientation figure and/or the designated crystal orientation figure of the crystal lying at the selected position, and the crystal orientation figure and/or the designated crystal orientation figure of the crystal lying at the other position, to an external display device such that the charged particle beam image, the crystal orientation figure and/or the designated crystal orientation figure of the crystal lying at the selected position, and the crystal orientation figure and/or the designated crystal orientation figure of the crystal lying at the other position are displayed at the same time on the display device.

10. The tilting parameters calculating device according to claim 8, further comprising a tilting angle adjusting unit, wherein the tilting angle adjusting unit is configured to, based on the tilting parameters calculated by the tilting parameters calculating unit, perform at least one of instructing the sample stage to change the tilting direction and the tilting value of the sample and instructing the charged particle beam device to change the tilting direction and the tilting value of the charged particle beam, and when the incident direction of the charged particle beam with respect to the sample is changed in response to the instruction from the tilting angle adjusting unit, the output unit further acquires a charged particle beam image on the surface corresponding to the changed incident direction, the charged particle beam image being measured by the charged particle beam device, and outputs the charged particle beam image, and the crystal orientation figure and/or the designated crystal orientation figure of the crystal lying at the selected position corresponding to the predetermined incident direction and/or the changed incident direction on the surface, or the charged particle beam image, the crystal orientation figure and/or the designated crystal orientation figure of the crystal lying at the selected position, and the crystal orientation figure and/or the designated crystal orientation figure of the crystal lying at the other position corresponding to the predetermined incident direction and/or the changed incident direction on the surface, to an external display device such that the image and figures are displayed at the same time on the display device.

11. The tilting parameters calculating device according to claim 2, further comprising a tilting angle adjusting unit, wherein the tilting angle adjusting unit is configured to, based on the tilting parameters calculated by the tilting parameters calculating unit, perform at least one of instructing the sample stage to change the tilting direction and the tilting value of the sample and instructing the charged particle beam device to change the tilting direction and the tilting value of the charged particle beam.

12. A sample stage comprising the tilting parameters calculating device according to claim 11, wherein the tilting direction and the tilting value of the sample can be changed in response to the instruction from the tilting angle adjusting unit.

13. A charged particle beam device comprising the sample stage according to claim 12.

14. A charged particle beam device comprising the tilting parameters calculating device according to claim 11, wherein the tilting direction and the tilting value of the charged particle beam can be changed in response to the instruction from the tilting angle adjusting unit.

15. A non-transitory computer readable recording medium storing a program for use in a charged particle beam device for making a charged particle beam irradiated to a surface of a sample mounted on a sample stage, the program being run on a computer to calculate tilting parameters, the tilting parameters being input parameters to control a tilting direction and a tilting value of the sample and/or the charged particle beam, the input parameters being necessary to change an incident direction of the charged particle beam with respect to the sample, the program including commands causing the computer to execute a step of, with an incident direction of the charged particle beam with respect to the sample being a predetermined incident direction, calculating the tilting parameters based on information that indicates an incident direction of the charged particle beam with respect to a crystal lying at a selected position on the surface of the sample, the information being designated on a crystal orientation figure, which is a diagram illustrating the incident direction of the charged particle beam with respect to a crystal coordinate system of the crystal.

16. The non-transitory computer readable recording medium according to claim 15, the program including commands causing the computer to execute:

(a) a step of acquiring crystal orientation information on the surface of the sample;

(b) a step of creating the crystal orientation figure of the crystal lying at the selected position, based on the orientation information; and (c) a step of calculating the tilting parameters.

* * * * *